(12) United States Patent
Kawanishi et al.

(10) Patent No.: US 11,710,942 B2
(45) Date of Patent: Jul. 25, 2023

(54) METHOD OF MANUFACTURING LIGHT-EMITTING MODULE, LIGHT-EMITTING MODULE, AND DEVICE

(71) Applicant: SONY CORPORATION, Tokyo (JP)

(72) Inventors: Hidekazu Kawanishi, Tokyo (JP); Jugo Mitomo, Kanagawa (JP); Kei Satou, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 110 days.

(21) Appl. No.: 16/769,357

(22) PCT Filed: Sep. 13, 2018

(86) PCT No.: PCT/JP2018/033935
§ 371 (c)(1),
(2) Date: Jun. 3, 2020

(87) PCT Pub. No.: WO2019/116654
PCT Pub. Date: Jun. 20, 2019

(65) Prior Publication Data
US 2020/0313400 A1 Oct. 1, 2020

(30) Foreign Application Priority Data
Dec. 13, 2017 (JP) ................................. 2017-238261

(51) Int. Cl.
*H01S 5/40* (2006.01)
*H01S 5/02* (2006.01)
(Continued)

(52) U.S. Cl.
CPC ............. *H01S 5/4031* (2013.01); *B41J 2/455* (2013.01); *H01S 5/0201* (2013.01);
(Continued)

(58) Field of Classification Search
CPC ..... H01S 5/4031–4068; H01S 5/02251; H01S 5/02326; H01S 5/02345; H01S 5/02355;
(Continued)

(56) References Cited

U.S. PATENT DOCUMENTS 4,364,064 A * 12/1982 Baues ........................ B41J 2/45
355/1
5,053,836 A * 10/1991 McClurg ............. H01L 21/3043
438/33
(Continued)

FOREIGN PATENT DOCUMENTS

CN 107615600 A 1/2018
DE 3739408 A1 * 6/1989
(Continued)

OTHER PUBLICATIONS

International Search Report and Written Opinion of PCT Application No. PCT/JP2018/033935, dated Dec. 4, 2018, 17 pages of ISRWO.
(Continued)

*Primary Examiner* — Joshua King
(74) *Attorney, Agent, or Firm* — Chip Law Group

(57) ABSTRACT

To provide a method of manufacturing a light-emitting module capable of accurately arranging a plurality of light-emitting elements at narrow intervals, and a light-emitting module manufactured by the method of manufacturing, and, moreover, a device on which the light-emitting module is mounted. Provided is a method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, the method including arranging the
(Continued)

plurality of light-emitting elements on the substrate at predetermined intervals along the width direction in the light-emitting module, by causing side surfaces of the respective light-emitting element arrays adjacent to each other along the width direction to be in contact with each other and mounting the respective light-emitting element arrays on the substrate.

14 Claims, 20 Drawing Sheets

(51) Int. Cl.
*H01S 5/02326* (2021.01)
*H01S 5/0239* (2021.01)
*H01S 5/0237* (2021.01)
*H01S 5/02345* (2021.01)
*H01S 5/02251* (2021.01)
*H01S 5/02375* (2021.01)
*H01S 5/02234* (2021.01)
*H01S 5/024* (2006.01)
*B41J 2/455* (2006.01)

(52) U.S. Cl.
CPC .......... *H01S 5/0237* (2021.01); *H01S 5/0239* (2021.01); *H01S 5/02251* (2021.01); *H01S 5/02326* (2021.01); *H01S 5/02345* (2021.01); *H01S 5/02375* (2021.01); *H01S 5/02234* (2021.01); *H01S 5/02476* (2013.01)

(58) Field of Classification Search
CPC .... H01S 5/0236; H01S 5/0237; H01S 5/0239; H01S 5/02476–02492; H01S 5/02375–02385; H01S 5/02365; B41J 2/455; B41J 2/45; B41J 2/451
See application file for complete search history.

(56) References Cited

U.S. PATENT DOCUMENTS

| | | | | |
|---|---|---|---|---|
| 5,177,500 A * | 1/1993 | Ng | ............................ | B41J 2/45 361/826 |
| 5,515,391 A * | 5/1996 | Endriz | ................ | H01S 5/02415 372/50.1 |
| 5,691,760 A * | 11/1997 | Hosier | ..................... | H04N 1/03 257/E25.012 |
| 5,870,128 A * | 2/1999 | Yazawa | .................... | B41J 2/155 257/E21.705 |
| 5,909,458 A * | 6/1999 | Freitas | ................. | H01S 5/4025 372/36 |
| 5,946,022 A * | 8/1999 | Kamimura | ................. | B41J 2/45 347/237 |
| 5,972,729 A * | 10/1999 | Shimizu | ..................... | B41J 2/45 438/33 |
| 5,997,152 A * | 12/1999 | Taninaka | ................... | B41J 2/45 362/249.06 |
| 6,205,160 B1 * | 3/2001 | Grewell | ............. | H01S 5/02365 372/75 |
| 6,205,162 B1 | 3/2001 | Shodo | | |
| 6,219,362 B1 * | 4/2001 | Hillmer | ................ | H01S 5/0612 372/20 |
| 6,507,594 B1 | 1/2003 | Furukawa et al. | | |
| 6,836,278 B2 * | 12/2004 | Saito | .................... | G02B 26/123 347/237 |
| 6,993,059 B2 * | 1/2006 | Anikitchev | ........ | G02B 19/0057 372/100 |
| 7,154,926 B2 * | 12/2006 | Kouta | .............. | H01S 5/02423 372/29.013 |
| 7,180,099 B2 * | 2/2007 | Ogihara | ............. | G03G 15/043 257/72 |
| 7,432,132 B1 | 10/2008 | Rotter et al. | | |
| 7,586,962 B1 | 9/2009 | Rotter et al. | | |
| 8,384,221 B2 * | 2/2013 | Suzuki | ........................ | B41J 2/45 257/E33.068 |
| 9,429,867 B2 * | 8/2016 | Suzuki | .................... | F21V 23/06 |
| 9,478,526 B2 | 10/2016 | Lee | | |
| 2001/0026573 A1 | 10/2001 | Takayama et al. | | |
| 2001/0030983 A1 | 10/2001 | Yuri et al. | | |
| 2001/0033590 A1 | 10/2001 | Yuri et al. | | |
| 2002/0015088 A1 * | 2/2002 | Inoue | .................... | G03F 7/2055 347/238 |
| 2002/0186730 A1 * | 12/2002 | Garbuzov | ............. | H01S 5/4031 372/75 |
| 2003/0016715 A1 | 1/2003 | Furukawa et al. | | |
| 2003/0058898 A1 * | 3/2003 | Beier | .................. | H01S 5/06243 372/3 |
| 2003/0127006 A1 * | 7/2003 | Majewicz | .................. | B41J 2/45 101/483 |
| 2004/0042101 A1 * | 3/2004 | Wang | ................ | G02B 6/12004 359/883 |
| 2004/0179793 A1 * | 9/2004 | McColloch | .......... | G02B 6/4267 257/E25.02 |
| 2004/0196877 A1 * | 10/2004 | Kawakami | .......... | H01S 5/02212 372/23 |
| 2005/0151824 A1 * | 7/2005 | Iwamatsu | .................. | B41J 2/45 347/224 |
| 2005/0169327 A1 * | 8/2005 | Eden | ...................... | H01S 5/4031 372/32 |
| 2005/0169337 A1 * | 8/2005 | Downing | ............. | H04N 9/3129 372/50.1 |
| 2005/0169581 A1 * | 8/2005 | Downing | .............. | H01S 5/4006 385/39 |
| 2005/0280010 A1 * | 12/2005 | McColloch | .......... | G02B 6/4201 257/82 |
| 2006/0045143 A1 * | 3/2006 | Anikitchev | ............. | H01S 5/147 372/98 |
| 2006/0104565 A1 * | 5/2006 | Shimada | ............. | H01S 5/4025 385/14 |
| 2006/0131757 A1 * | 6/2006 | Yu | ............................. | B41J 2/45 257/E25.032 |
| 2007/0109395 A1 * | 5/2007 | Watanabe | ........ | G03G 15/04054 347/238 |
| 2007/0246718 A1 * | 10/2007 | Sagimori | .................... | B41J 2/45 257/E25.02 |
| 2008/0054076 A1 * | 3/2008 | Schleuning | ......... | H01S 5/02253 235/462.35 |
| 2008/0069167 A1 * | 3/2008 | Gorton | .................. | H01S 5/4025 372/50.12 |
| 2009/0027896 A1 * | 1/2009 | Nishimura | .................. | B41J 2/44 362/311.06 |
| 2009/0073252 A1 * | 3/2009 | Wiggins | ................. | B41J 2/45 347/247 |
| 2009/0243092 A1 * | 10/2009 | Nishimura | .......... | H01L 25/0657 257/737 |
| 2010/0109024 A1 * | 5/2010 | Yonehara | ................. | B41J 2/45 257/88 |
| 2010/0142581 A1 * | 6/2010 | Baker | ................. | H01S 5/04256 372/50.123 |
| 2010/0243988 A1 * | 9/2010 | Kamikawa | .......... | H01S 5/34333 438/46 |
| 2011/0102537 A1 * | 5/2011 | Griffin | ..................... | B41J 2/4753 347/237 |
| 2012/0305946 A1 * | 12/2012 | Kuk | ........................ | F21K 9/00 257/89 |
| 2015/0055670 A1 * | 2/2015 | Inoue | ................. | H01S 5/04254 372/45.01 |
| 2016/0103328 A1 * | 4/2016 | Heinrich | ............ | G02B 19/0014 359/809 |
| 2016/0126696 A1 * | 5/2016 | Gudeman | ............ | H04B 10/516 359/484.02 |
| 2017/0033283 A1 * | 2/2017 | Pinarbasi | ................ | H01L 43/08 |
| 2017/0357097 A1 * | 12/2017 | Heinrich | ................ | H01S 5/005 |
| 2018/0175583 A1 | 6/2018 | Sakamoto et al. | | |
| 2018/0191135 A1 * | 7/2018 | Yanase | ................... | H01S 5/4087 |
| 2018/0306952 A1 * | 10/2018 | Marutani | ............ | G02B 5/1866 |

(56) References Cited

U.S. PATENT DOCUMENTS

2018/0326744 A1* 11/2018 Sawamura .............. B41J 2/473
2018/0333967 A1* 11/2018 Uetake .................... B41M 5/46
2020/0238605 A1*  7/2020 Mitomo ................ B29C 64/135

FOREIGN PATENT DOCUMENTS

| | | | | |
|---|---|---|---|---|
| DE | H09186367 A | * | 7/1997 | |
| DE | 10204397 A1 | * | 8/2002 | ........... H01S 5/4031 |
| DE | 10254566 A1 | * | 6/2004 | ............. H01S 5/042 |
| DE | 102004006932 B3 | * | 10/2005 | ............. G02B 6/262 |
| DE | 102020124564 A1 | * | 7/2021 | |
| EP | 0723323 A2 | * | 7/1996 | |
| EP | 0790132 A2 | * | 8/1997 | |
| EP | 0905833 A2 | | 3/1999 | |
| EP | 1139527 A2 | | 10/2001 | |
| EP | 1143584 A2 | | 10/2001 | |
| EP | 1146617 A2 | | 10/2001 | |
| EP | 3312950 A1 | | 4/2018 | |
| JP | 62-173783 A | | 7/1987 | |
| JP | 01-251762 A | | 10/1989 | |
| JP | 03081164 A | * | 4/1991 | |
| JP | H0880637 A | * | 3/1996 | |
| JP | 09-283808 A | | 10/1997 | |
| JP | 10-270805 A | | 10/1998 | |
| JP | H11145561 A | * | 5/1999 | |
| JP | 11-168263 A | | 6/1999 | |
| JP | 2001-284732 A | | 10/2001 | |
| JP | 2002-329936 A | | 11/2002 | |
| JP | 2002-335032 A | | 11/2002 | |
| JP | 2002-374031 A | | 12/2002 | |
| JP | 2003-037323 A | | 2/2003 | |
| JP | 2004-233617 A | | 8/2004 | |
| JP | 2005-158902 A | | 6/2005 | |
| JP | 2006103307 A | * | 4/2006 | ............... B41J 2/45 |
| JP | 2007096160 A | * | 4/2007 | ............... B41J 2/45 |
| JP | 2008-292913 A | | 12/2008 | |
| JP | 2009-237728 A | | 10/2009 | |
| JP | 2013-057719 A | | 3/2013 | |
| JP | 2017-011043 A | | 1/2017 | |
| NL | 2022241 B1 | * | 7/2020 | |
| TW | 201142182 A1 | | 12/2011 | |
| WO | WO-0126190 A1 | * | 4/2001 | ......... H01S 5/02248 |
| WO | 2016/203789 A1 | | 12/2016 | |
| WO | WO-2017135200 A1 | * | 8/2017 | .............. B41J 2/455 |
| WO | WO-2018074672 A1 | * | 4/2018 | ............... G02B 7/02 |
| WO | WO-2021140160 A1 | * | 7/2021 | ............. G01S 17/10 |

OTHER PUBLICATIONS

Office Action for JP Patent Application No. 2019-558907, dated Aug. 2, 2022, 08 pages of English Translation and 08 pages of Office Action.

* cited by examiner

METHOD OF MANUFACTURING LIGHT-EMITTING MODULE, LIGHT-EMITTING MODULE, AND DEVICE

CROSS REFERENCE TO RELATED APPLICATIONS

This application is a U.S. National Phase of International Patent Application No. PCT/JP2018/033935 filed on Sep. 13, 2018, which claims priority benefit of Japanese Patent Application No. JP 2017-238261 filed in the Japan Patent Office on Dec. 13, 2017. Each of the above-referenced applications is hereby incorporated herein by reference in its entirety.

TECHNICAL FIELD

The present disclosure relates to a method of manufacturing a light-emitting module, a light-emitting module, and a device.

BACKGROUND ART

In light source units in various devices such as a stereolithography device (three-dimensional printer), a laser printer, a laser display device, and a measuring device, a light-emitting module is widely used in which a plurality of light-emitting elements (for example, light emitting diode (LED) elements and laser elements) is arranged along one direction at predetermined intervals. By the way, as a method of arranging the light-emitting elements at predetermined intervals, for example, as disclosed in Patent Document 1 below, a method can be mentioned of arranging chips on which a plurality of light-emitting elements is formed in a staggered manner.

CITATION LIST

Patent Document

Patent Document 1: Japanese Patent Application Laid-Open No. H09-283808

SUMMARY OF THE INVENTION

Problems to be Solved by the Invention

By the way, in manufacturing of a light-emitting module used in a three-dimensional (3D) printer and the like, it is required to accurately arrange a plurality of light-emitting elements at narrow intervals. This is because, by arranging more light-emitting elements at narrow intervals, for example, the definition can be further improved of a formed object formed by the 3D printer.

Thus, in the present disclosure, devised is a new and improved method of manufacturing a light-emitting module capable of accurately arranging a plurality of light-emitting elements at narrow intervals, and a light-emitting module manufactured by the method of manufacturing, moreover, a device on which the light-emitting module is mounted.

Solutions to Problems

According to the present disclosure, provided is a method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, the method including arranging the plurality of light-emitting elements on the substrate at predetermined intervals along the width direction in the light-emitting module, by causing side surfaces of the respective light-emitting element arrays adjacent to each other along the width direction to be in contact with each other and mounting the respective light-emitting element arrays on the substrate.

Furthermore, according to the present disclosure, provided is a method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, the method including: forming a first positioning portion on surfaces facing the substrate of the respective light-emitting element arrays; forming a second positioning portion on a surface facing the plurality of light-emitting element arrays of the substrate; and arranging the plurality of light-emitting elements on the substrate at predetermined intervals along the width direction in the light-emitting module, by causing the first positioning portion and the second positioning portion to engage with each other, and mounting the respective light-emitting element arrays on the substrate.

Furthermore, according to the present disclosure, provided is a method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a connector electrically connected to the plurality of light-emitting element arrays, the respective light-emitting element arrays each including a light-emitting element array chip provided with the plurality of light-emitting elements, and a circuit board on which a connector terminal electrically connected to the connector is provided and the light-emitting element array chip is mounted, the method including arranging the plurality of light-emitting elements at predetermined intervals along the width direction in the light-emitting module, by inserting the connector terminals of the respective light-emitting element arrays into an opening of the connector.

Furthermore, according to the present disclosure, provided is a light-emitting module including: a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, in which side surfaces of the respective light-emitting element arrays adjacent to each other along the width direction are in contact with each other, and the plurality of light-emitting elements is arranged on the substrate at predetermined intervals along the width direction.

Moreover, according to the present disclosure, a device is provided on which the light-emitting module is mounted.

Effects of the Invention

As described above, according to the present disclosure, a plurality of light-emitting elements can be accurately arranged at narrow intervals.

Note that, the above-described effect is not necessarily restrictive, and, in addition to the above-described effect, or in place of the above-described effect, any of effects described in the present specification, or other effects that can be grasped from the present specification may be exhibited.

MODE FOR CARRYING OUT THE INVENTION

Figure 1:
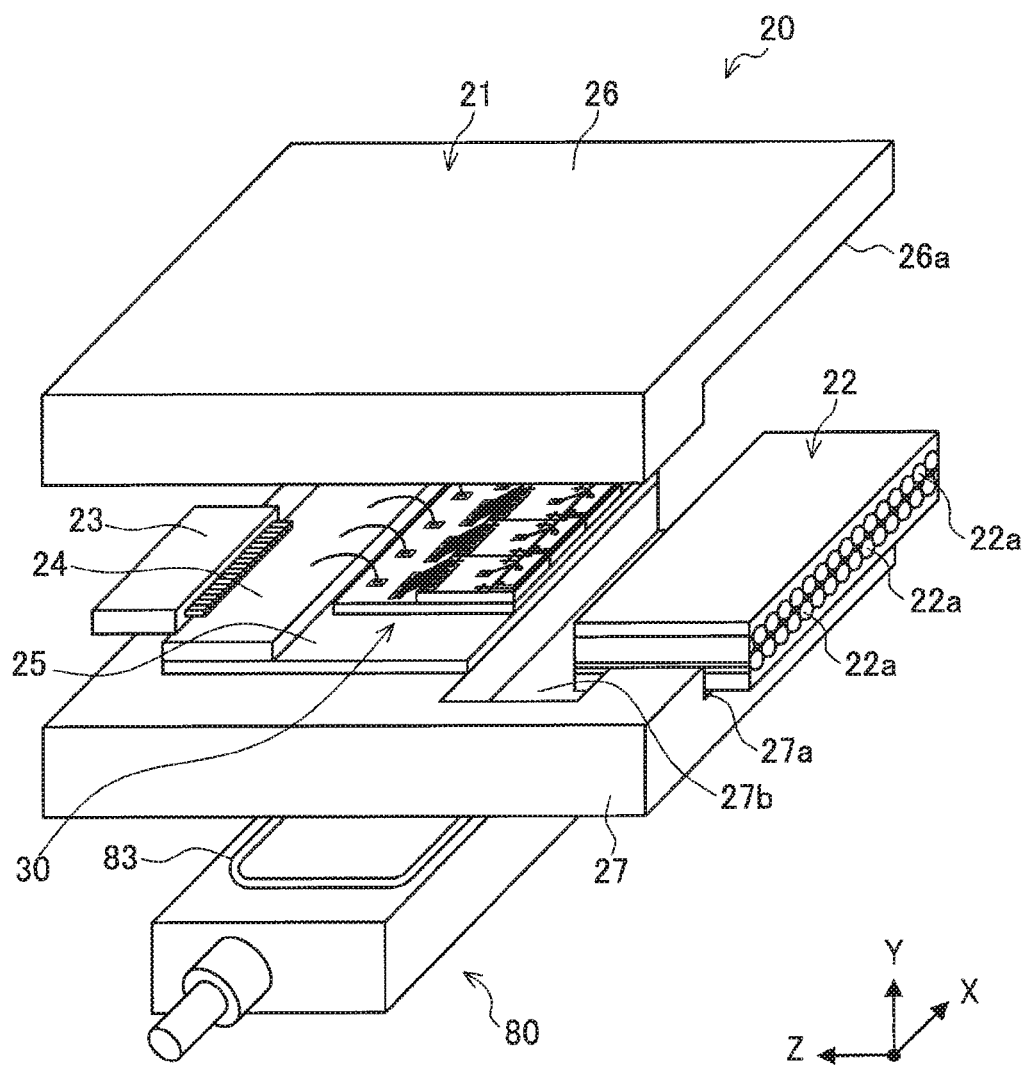
FIG. 1 is an exploded perspective view illustrating an example of a light source unit 20 of the present disclosure.

Preferred embodiments of the present disclosure will be described in detail below with reference to the accompanying drawings. Note that, in the present specification and the drawings, components having substantially the same functional configuration are denoted by the same reference signs, and redundant explanations will be omitted.

Furthermore, in this specification and the drawings, similar components in different embodiments may be distinguished from each other by different alphabets added after the same reference numerals. However, in a case where it is not necessary to distinguish the similar components from each other, only the same reference numerals are given.

Furthermore, the drawings referred to in the following description are drawings for description and promoting understanding of an embodiment of the present disclosure, and to facilitate understanding, the shapes, dimensions, ratios, and the like illustrated in the drawings may be different from actual ones. Moreover, in the following description, the vertical direction of a laminated structure such as a substrate corresponds to the vertical direction in a light-emitting module 30 and a light source unit 20 manufactured, unless otherwise specified. In other words, the vertical direction of the laminated structure such as the substrate corresponds to the vertical direction in a case where a cooling mechanism 80 is positioned at the lower side in the light source unit 20, and may be different from the vertical direction according to the actual gravitational acceleration.

In the following description, numerical values regarding dimensions such as intervals and lengths not only mean numerical values that are the same as mathematically defined numbers, but also include a case where there is an industrially and technically allowable degree of difference in a manufacturing step and use of light-emitting modules.

Moreover, in the following description, "connection" means to electrically connect a plurality of elements to each other, unless otherwise specified. Moreover, the "connection" in the following description includes not only a case where the plurality of elements is directly and electrically connected to each other, but also a case where the plurality of elements is indirectly and electrically connected to each other via other elements.

Note that, the description will be given in the following order.

1. Schematic configuration of light source unit 20
2. Schematic configuration of light-emitting module 30
3. Background that leads the present inventors to create embodiments according to the present disclosure
4. First Embodiment
 4.1 Method of manufacturing light-emitting module 30
 4.2 Light-emitting module 30
 4.3 Method of manufacturing light source unit 20
5. Second Embodiment
6. Third Embodiment
7. Fourth Embodiment 7.1 Method of manufacturing light-emitting module 30b
7.2 Modifications
8. Fifth Embodiment
9. Sixth Embodiment
10. Conclusion
11. Supplement

SCHEMATIC CONFIGURATION OF LIGHT SOURCE UNIT 20

First, before describing an embodiment of the present disclosure, a schematic configuration will be described of the light source unit 20 used in various devices such as a 3D printer (stereolithography device), a laser printer, a laser display device, and a measuring device, with reference to FIG. 1. FIG. 1 is an exploded perspective view illustrating an example of the light source unit 20 of the present disclosure.

For example, the light source unit 20 illustrated in FIG. 1 has the width (X-axis direction) of about 420 mm, the depth (Z-axis direction) of about 30 mm, and the height (Y-axis direction) of about 50 mm. Note that, the light source unit 20 is not limited to having the above-described dimensions, and can be appropriately changed. Thus, although not illustrated in FIG. 1, the light source unit 20 actually extends further along the X-axis direction.

As illustrated in FIG. 1, the light source unit 20 includes a housing 21 that houses each part of the light source unit 20, the light-emitting module 30 housed in the housing 21, and a convergent rod lens 22 arranged on the light emission side of the light-emitting module 30. Moreover, the light source unit 20 includes a connector 23 housed in the housing 21, a glass epoxy substrate 24 that engages with the connector 23, and a heat transfer plate (heat sink substrate) 25 on which the light-emitting module 30 and the glass epoxy substrate 24 are mounted.

Hereinafter, each part of the light source unit 20 will be described.

(Housing 21)

The housing 21 has a rectangular parallelepiped shape having a long axis in the X-axis direction, and includes a first base 26 positioned on the upper side in FIG. 1 and a second base 27 positioned on the lower side in FIG. 1. The housing 21 includes various metal materials (for example, stainless steel). Note that, the material used for the housing 21 is not particularly limited as long as it has at least a certain strength and thermal conductivity. The first base 26 and the second base 27 are fixed by screwing or the like, and are integrated to form the housing 21. Furthermore, as illustrated in FIG. 1, the first base 26 includes a groove portion 26a for fitting the convergent rod lens 22, a groove portion (not illustrated) for fitting the connector 23, and the like. Furthermore, the second base 27 includes a groove portion 27a for fitting the convergent rod lens 22, a groove portion 27b formed between the light-emitting module 30 and the convergent rod lens 22, and the like. Moreover, as illustrated in FIG. 1, the cooling mechanism 80 is fixed to a surface positioned at the opposite side of the second base 27 from a surface on which the heat transfer plate 25 is arranged, with an O-ring 83 interposed therebetween.

(Convergent Rod Lens 22)

The convergent rod lens 22 focuses the light emitted from each laser element of the light-emitting module 30 to form an image on a desired surface. The convergent rod lens 22 is fitted and fixed in an opening of the housing 21 formed by the groove portion 26a of the first base 26 and the groove portion 27a of the second base 27. In detail, as illustrated in FIG. 1, in the convergent rod lens 22, a plurality of cylindrical rod lenses 22a extending in the Z-axis direction is arranged along two axial directions of the X-axis direction and the Y-axis direction. For example, the convergent rod lens 22 has a focal length of about 2 mm.

(Heat Transfer Plate 25)

The heat transfer plate 25 includes various metal materials (for example, copper). Note that, the material used for the heat transfer plate 25 is not particularly limited as long as it has at least a certain strength and thermal conductivity. On the heat transfer plate 25, the light-emitting module 30 and the glass epoxy substrate 24 are mounted, and the heat transfer plate 25 on which these are mounted is fixed on the second base 27 with an adhesive having a high thermal conductivity (for example, an ultraviolet curable silver paste) interposed therebetween. Note that, the fixing between the heat transfer plate 25 and the second base 27 is performed by screwing the screws from the second base 27 side.

(Connector 23)

The connector 23 is electrically connected to the glass epoxy substrate 24, and power for driving the light source unit 20 and various signals are input to the connector 23. The glass epoxy substrate 24 and the light-emitting module 30 are electrically connected to each other, for example, via wires.

Note that, a gap between the first base 26 and the second base 27, a gap between the housing 21 and the convergent rod lens 22, and a gap between the housing 21 and the connector 23 are sealed with an adhesive to prevent foreign matter from entering from the outside of the light source unit 20.

2. SCHEMATIC CONFIGURATION OF LIGHT-EMITTING MODULE 30

Figure 2:
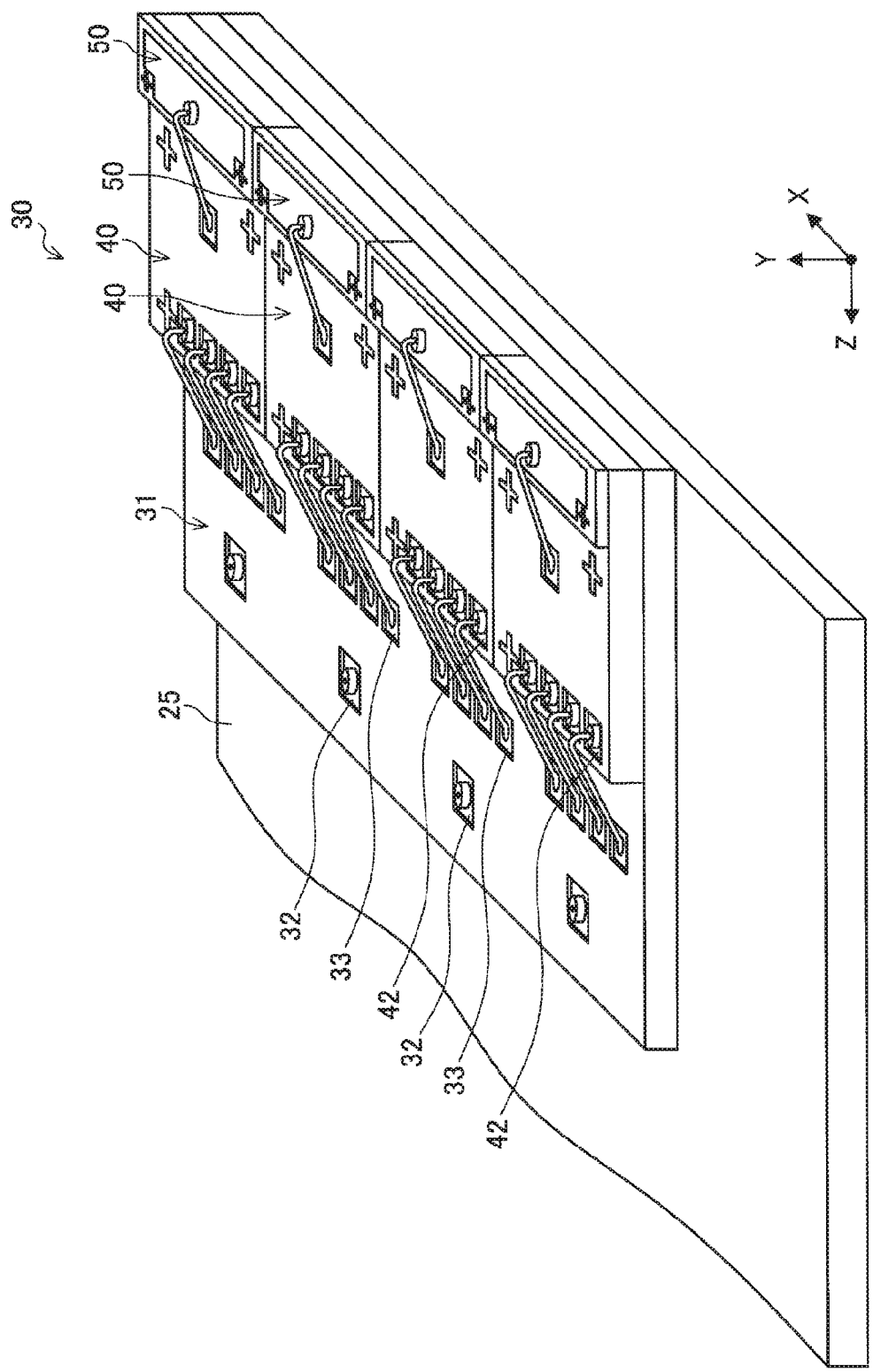
FIG. 2 is a perspective view illustrating an example of a light-emitting module 30 of the present disclosure.
Figure 3:
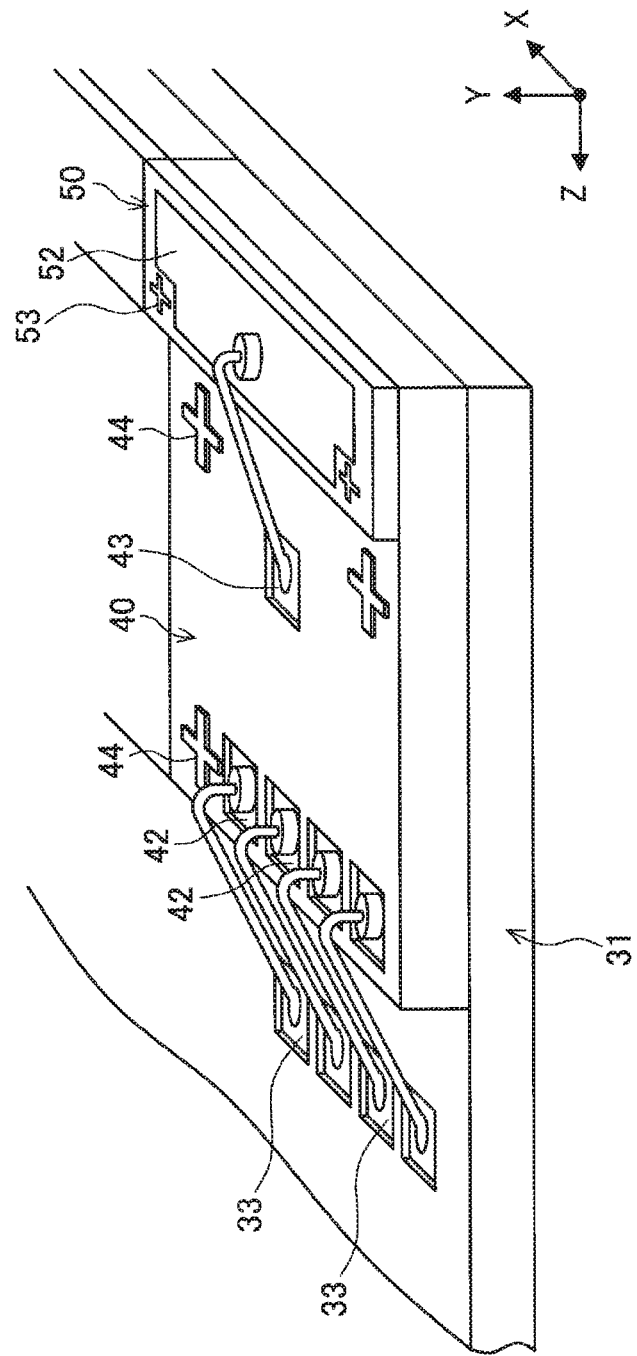
FIG. 3 is an enlarged perspective view illustrating a part of the light-emitting module 30 of FIG. 2.

Next, a schematic configuration will be described of the light-emitting module 30 of the present disclosure with reference to FIGS. 2 and 3. FIG. 2 is a perspective view illustrating an example of the light-emitting module 30 of the present disclosure, and FIG. 3 is an enlarged perspective view illustrating a part of the light-emitting module 30 of FIG. 2.

As illustrated in FIG. 2, the light-emitting module 30 includes a plurality of driver integrated circuits (ICs) 31 mounted on the heat transfer plate 25, a plurality of sub-mounts 40 mounted on each driver IC 31, and a multi-laser chip 50 mounted on each sub-mount 40. Note that, in the present disclosure, the sub-mount 40 may be directly mounted on the heat transfer plate 25 without interposing the driver IC31. Moreover, in the present disclosure, the multi-laser chip 50 may be directly mounted on the driver IC 31 without interposing the sub-mount 40, or may be directly mounted on the heat transfer plate 25 without interposing the sub-mount 40 and the driver IC. In other words, in the light-emitting module 30 of the present disclosure, at least a plurality of the multi-laser chips 50 is mounted. Hereinafter, each part of the light-emitting module 30 will be described.

(Driver IC31)

As illustrated in FIG. 2, one or more driver ICs 31 are arranged on the heat transfer plate 25 along the X-axis direction. In the present disclosure, the number of driver ICs 31 arranged on the heat transfer plate 25 is not particularly limited. Furthermore, the size of the driver IC 31 is not particularly limited, and for example, the width (X-axis direction) can be about 20 mm, the depth (Z-axis direction) can be about several mm, and the height (thickness) (Y-axis direction) can be 100 μm to 500 μm. Moreover, the driver IC 31 can include, for example, a silicon substrate. Furthermore, the driver IC 31 includes a plurality of input electrode pads 32 and a plurality of output electrode pads 33 on the surface. The input electrode pads 32 each are electrically connected to the glass epoxy substrate 24 via a wire. On the other hand, the output electrode pads 33 each are electrically connected to an input electrode pad 42 provided on the sub-mount 40 via a wire. Moreover, the driver IC 31 is provided with an electronic circuit such as a drive circuit (not illustrated) for driving each laser element 51 of the multi-laser chip 50 on each of the plurality of sub-mounts 40 mounted.

(Sub-Mount 40)

About several tens of the sub-mounts 40 are mounted on one driver IC 31 to be arranged in the X-axis direction. Note that, in the present disclosure, the number of the sub-mounts 40 mounted is not particularly limited, and can be appropriately selected. Furthermore, the sub-mount 40 is fixed on the driver IC 31 with a thermoplastic paste having a high thermal conductivity and being softened by heat interposed therebetween, for example. The size of the sub-mount 40 is not particularly limited, and for example, the width (X-axis direction) can be about 100 μm to 20000 μm, the depth (Z-axis direction) can be about 1000 μm, and the height (thickness) (Y-axis direction) can be about several tens μm.

The sub-mount 40 includes, for example, a silicon substrate. As illustrated in FIG. 3, a plurality of the input electrode pads 42, one common electrode pad 43, and a plurality of alignment marks 44 are provided on the surface of the sub-mount 40. The plurality of input electrode pads 42 is electrically connected respectively to the output electrode pads 33 of the driver IC 31 via wires. In FIG. 3, four input electrode pads 42 are formed on the surface of the sub-mount 40, but the present disclosure is not limited to this. Furthermore, the common electrode pad 43 is electrically connected to a common electrode 52 of the multi-laser chip 50 via a wire. Note that, the sizes of the input electrode pad 42 and the common electrode pad 43 are not particularly limited, and can be, for example, about 90 μm×90 μm.

In more detail, the sub-mount 40 is provided with an electronic circuit such as a switching circuit (not illustrated) for individually switching and causing the laser elements 51 of the mounted multi-laser chip 50 to emit light. Furthermore, the alignment mark 44 is used for alignment when the multi-laser chip 50 is mounted on the sub-mount 40.

(Multi-Laser Chip 50)

As illustrated in FIG. 3, one multi-laser chip 50 is mounted on one sub-mount 40. Note that, in the present disclosure, the number of the multi-laser chips 50 mounted on one sub-mount 40 is not limited to one as illustrated in FIG. 3, but may be plural. The size of the multi-laser chip 50 is not particularly limited, and for example, the width (X-axis direction) can be about 100 μm to 20000 μm, the depth (Z-axis direction) can be about several hundred μm, and the height (thickness) (Y-axis direction) can be about 10 μm to 100 μm.

Figure 4:
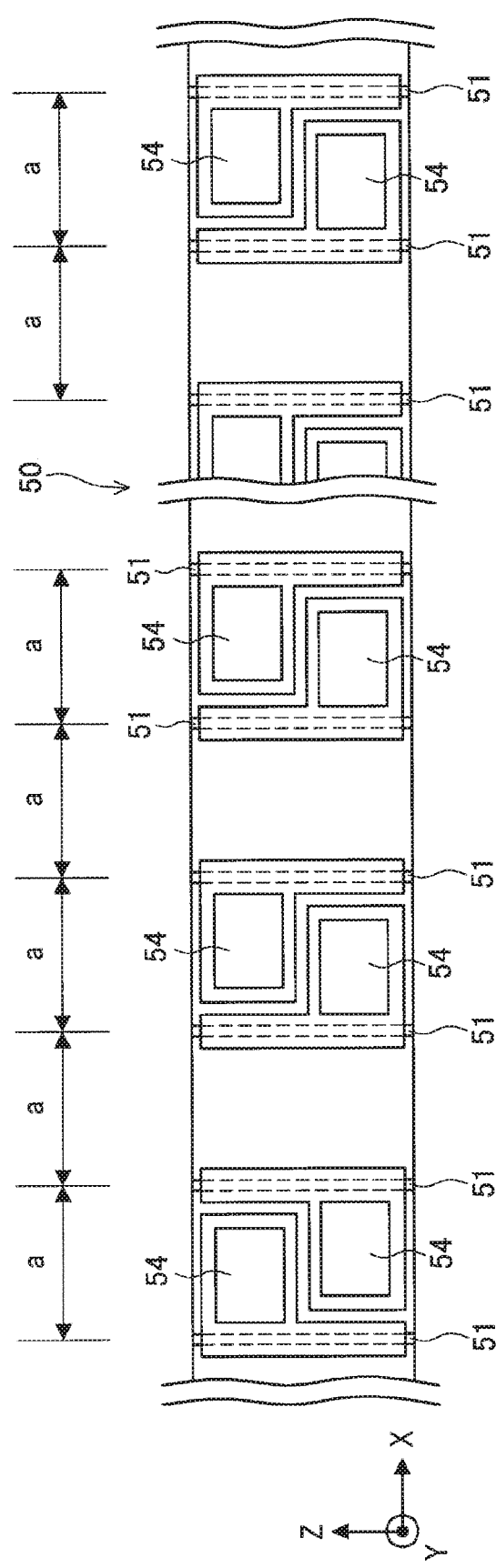
FIG. 4 is a back view of a multi-laser chip 50 of the present disclosure.

The multi-laser chip 50 includes the plurality of laser elements 51 each having a long shape and including a resonator arranged along the Z-axis direction (see FIG. 4). The plurality of laser elements 51 is arranged side by side at predetermined intervals a (for example, about 10 μm to 50 μm) in the X-axis direction (width direction), and emits light along the Z-axis direction. For example, each laser element 51 described above can be an edge-emitting semiconductor light-emitting element (edge-emitting light-emitting element) that emits light from an end face (emission end face) of the laminated structure of the laser element 51. Note that, in the following description, the emission end face of the laser element 51 means a face on the right side among two surfaces extending along the X-axis direction in FIG. 3, in other words, two surfaces having normal lines extending along the Z-axis direction. Furthermore, the number of the laser elements 51 provided in the multi-laser chip 50 of the present disclosure can be set depending on the yield of the laser elements 51, and the like, and the size of the multi-laser chips 50 can be appropriately selected depending on the set number of the laser elements 51. Moreover, in the following description, the width direction (X-axis direction) refers to a direction perpendicular to the resonator length direction in a plane parallel to the resonator length direction of the laser element 51.

In detail, the multi-laser chip 50 can include a group III-V nitride semiconductor substrate, for example, GaN or the like. Here, the group III-V nitride semiconductor includes at least one of group 13 elements in the periodic table (III-B group in the former International Union of Pure and Applied Chemistry (IUPAC) nomenclature), and at least N among group 15 elements (VB group in the former IUPAC nomenclature) in the periodic table. In other words, the laser element 51 provided in the multi-laser chip 50 can include, for example, a group III-V nitride semiconductor. Examples of the group III-V nitride semiconductor include a gallium nitride-based compound containing Ga and N. The gallium nitride-based compounds include, for example, GaN, AlGaN, AlGaInN, and the like. The group III-V nitride semiconductors may be doped with n-type impurities of group IV or VI elements such as Si, Ge, O, and Se, or p-type impurities of group II or IV elements such as Mg, Zn, and C, as necessary. In this case, the laser element 51 can emit ultraviolet light having a wavelength of, for example, about 400 nm.

Furthermore, as illustrated in FIG. 3, the multi-laser chip 50 includes the common electrode 52 commonly used by the plurality of laser elements 51, and a plurality of alignment marks 53. The common electrode 52 is formed over substantially the entire surface of the multi-laser chip 50, and is electrically connected to the common electrode pad 43 of the sub-mount 40 via a wire. The common electrode 52 is formed by laminating, for example, an alloy of Au and Ge, Ni, Au, and the like. Furthermore, the alignment mark 53 is used for alignment when the multi-laser chip 50 is mounted on the sub-mount 40.

Moreover, an outline of the back surface of the multi-laser chip 50 will be described with reference to FIG. 4. FIG. 4 is a back view of the multi-laser chip 50 of the present disclosure, and the vertical direction in the figure is reverse to that in FIG. 3. As illustrated in FIG. 4, the back surface of the multi-laser chip 50 includes the plurality of laser elements 51, and an individual electrode 54 electrically connected to each of the laser elements 51 provided to be sandwiched between the laser elements 51 adjacent to each other. Moreover, on the back surface of the multi-laser chip 50, as described above, the laser elements 51 are arranged side by side at predetermined intervals (for example, about 10 μm to 50 μm) in the X-axis direction (width direction).

3. BACKGROUND THAT LEADS THE PRESENT INVENTORS TO CREATE EMBODIMENTS ACCORDING TO THE PRESENT DISCLOSURE

In the above, the schematic configuration has been described of the light source unit 20 and the light-emitting module 30 according to the present disclosure. Subsequently, before describing the details of the embodiment according to the present disclosure, the background that leads the present inventors to create embodiments according to the present disclosure will be described.

As described above, in the light source unit 20 used in various devices such as a 3D printer (stereolithography device), a laser printer, a laser display device, and a measuring device, the light-emitting modules 30 is widely used in which a plurality of light-emitting elements is arranged along one direction at predetermined intervals. The present inventors have repeatedly studied the use of an edge-emitting laser element that emits light from an end face (emission end face) of a laminated structure of the element as a light source of the light-emitting module 30 used in the 3D printer.

The 3D printer is, for example, a device capable of forming a three-dimensional formed object by irradiating a photocurable resin with ultraviolet light or the like to cure the resin. The laser element 51 has a smaller spread (irradiation angle) of emitted light as compared to an LED element, and if the laser element 51 can be accurately arranged, the emitted light can be incident on the convergent rod lens without waste. Moreover, the laser element 51 has a high output despite its small size.

In addition, the laser element 51 generates high heat when emitting light; however, in the case of an edge-emitting laser element, a heat exhaust mechanism can be provided to sandwich the laser element 51 from above and below the laminated structure, so that the heat can be efficiently exhausted while the heat exhaust mechanism is downsized. Thus, since it is possible to efficiently emit light to the photocurable resin by using the edge-emitting laser element 51, the present inventors have studied hard about applying the edge-emitting laser element 51 to a 3D printer.

By the way, as described above, to further improve the definition of the formed object formed by the 3D printer, it is required to accurately arrange a large number of the laser elements 51 at narrow intervals in the light-emitting module 30 used in the 3D printer. More specifically, in a case where a formed object having a dimension of about several cm to several tens of cm is to be formed by the 3D printer, it is required to arrange about several thousand laser elements 51 accurately in a line at intervals of several tens of μm in the light-emitting module 30.

Thus, in a case where such a light-emitting module 30 is to be manufactured, for example, it is conceivable to mount individual laser elements 51 on a substrate at predetermined intervals. However, it cannot be said that such a manufacturing method is a preferable method since the work efficiency is extremely poor and a decrease in yield due to a displacement of the laser element 51 or the like is expected.

Furthermore, it is conceivable to manufacture the multi-laser chip 50 including the plurality of laser elements 51 arranged at predetermined intervals in advance when the laser element 51 itself is to be manufactured. However, in such a manufacturing method, there is a limitation of the size of a chip that can be manufactured in a semiconductor manufacturing process, and there is a limitation of the number of the laser elements 51 that can be arranged in a line on one multi-laser chip 50.

Furthermore, in a case where even one defective laser element 51 is included in the light-emitting module 30, the light-emitting module 30 itself becomes a defective product, so that each laser element 51 is inspected in advance before being mounted on the light-emitting module 30, and only a non-defective laser element 51 is mounted on the light-emitting module 30. Thus, in the method of manufacturing the light-emitting module 30, the multi-laser chip 50 including several to several tens of laser elements 51 is manufactured, and the inspection of the laser element 51 is performed on each multi-laser chip 50. Moreover, in the manufacturing method, the multi-laser chip 50 including only the non-defective laser element 51 is mounted on the light-emitting module 30. By doing so, while the number of wasted laser elements 51 can be reduced that are not mounted on the light-emitting module 30 despite being non-defective products, the work efficiency can be improved, and the yield in the manufacturing of the light-emitting module 30 can be maintained at a satisfactory level.

Moreover, if the multi-laser chip 50 includes several to several tens of laser elements 51 as described above, even in a case where a defect occurs in the laser element 51 at the time of manufacturing, or a defect occurs in the laser element 51 due to degradation over time by use of the light-emitting module 30, it is possible to cope with the case by replacing only the multi-laser chip 50 including a defective laser element 51.

However, the present inventors have studied and found that it is difficult to mount the plurality of multi-laser chip 50 on the substrate so that a number of the laser elements 51 are arranged accurately in a line at narrow intervals while aligning the end faces of the laser elements 51 from which light is emitted flush with each other. In detail, the present inventors have considered to arrange the multi-laser chips 50 in a staggered manner as in Patent Document 1 described above, or provide a step in advance on the substrate to provide each multi-laser chip 50 in each step; however, there has been a limitation to accurately arranging a large number of the laser elements 51 in a line at narrow intervals.

Specifically, according to the study of the present inventors, the light-emitting element arrays are arranged at narrow intervals in a staggered manner in Patent Document 1 described above, but there has been a limitation to perform arrangement with high accuracy in such a method. This is because, in Patent Document 1 described above, it is based on the premise that the light-emitting element is an LED element, and the LED element has a larger spread (irradiation angle) of emitted light as compared to the laser element 51, so that the use of the light-emitting module is not affected even in a case where the position of the LED element is shifted somewhat. Thus, it is considered that, even if the technology disclosed in Patent Document 1 described above can be applied to manufacturing of a light-emitting module using the LED element, in which a poor accuracy can be allowed somewhat, there is a limitation to apply the technology to the manufacturing of the light-emitting module 30 using the laser element 51 studied by the present inventors.

Thus, on the basis of the study as described above, the present inventors have created a method of manufacturing the light-emitting module 30 according to the embodiment of the present disclosure, capable of accurately arranging a plurality of light-emitting elements (laser elements 51) at narrow intervals. Hereinafter, details will be sequentially described of the method of manufacturing the light-emitting module 30 according to the embodiment of the present disclosure created by the present inventors.

Note that, in the following description, the embodiment of the present disclosure will be described as applying the edge-emitting laser element 51 to the light-emitting module 30 for the 3D printer; however, the embodiment of the present disclosure is not limited to such an application. For example, in the embodiment of the present disclosure, the light-emitting element may be an in-plane emitting laser element or an LED element. Moreover, in the embodiment of the present disclosure, the device on which the manufactured light-emitting module 30 is mounted is not limited to the 3D printer, but may be various devices such as a laser printer for printing on paper, a laser display device, and a measuring device.

4. FIRST EMBODIMENT

<4.1 Method of Manufacturing Light-Emitting Module 30>

Figure 5:
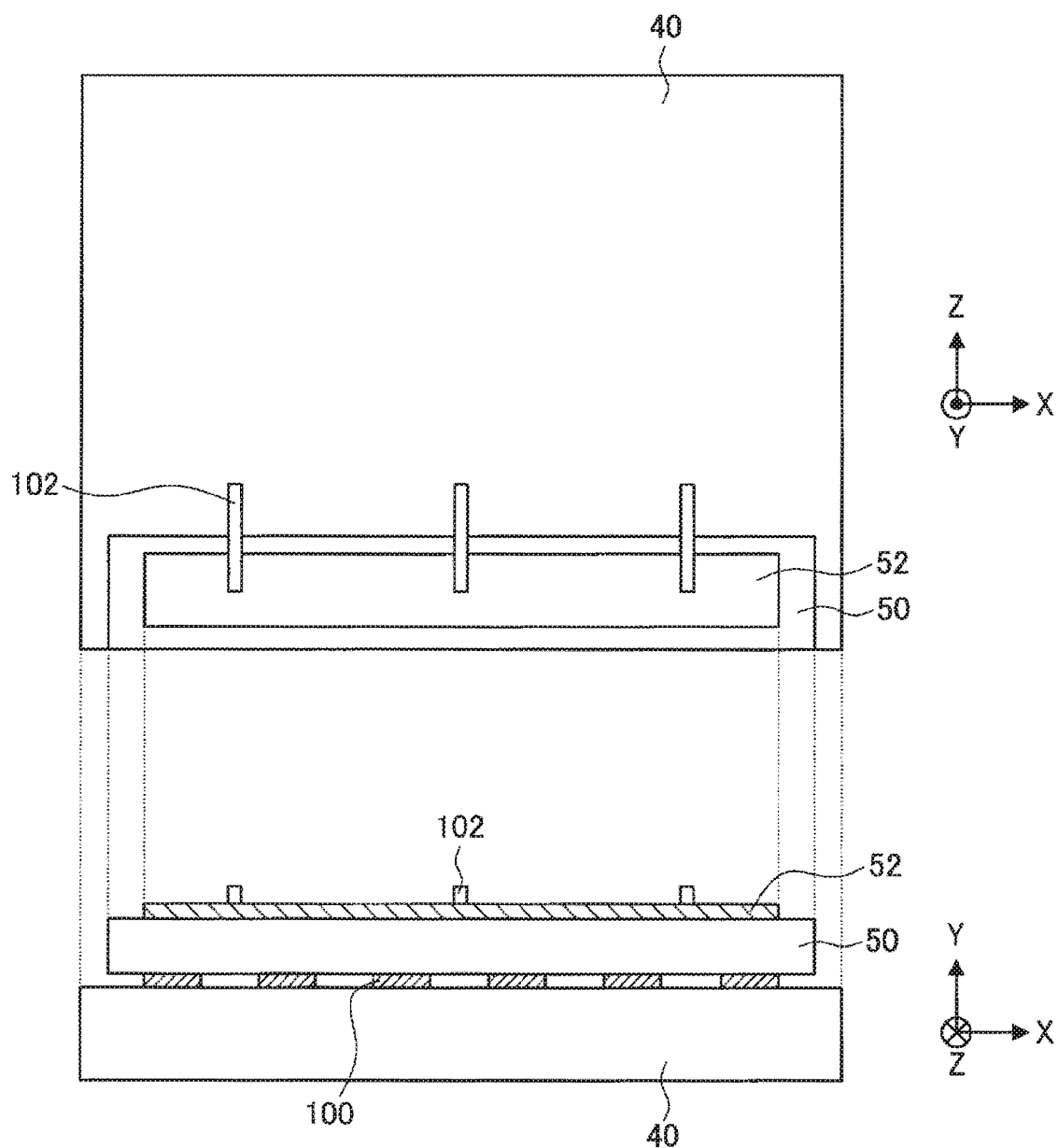
FIG. 5 is an explanatory diagram (part 1) for explaining a manufacturing step of the light-emitting module 30 according to a first embodiment of the present disclosure.
Figure 6:
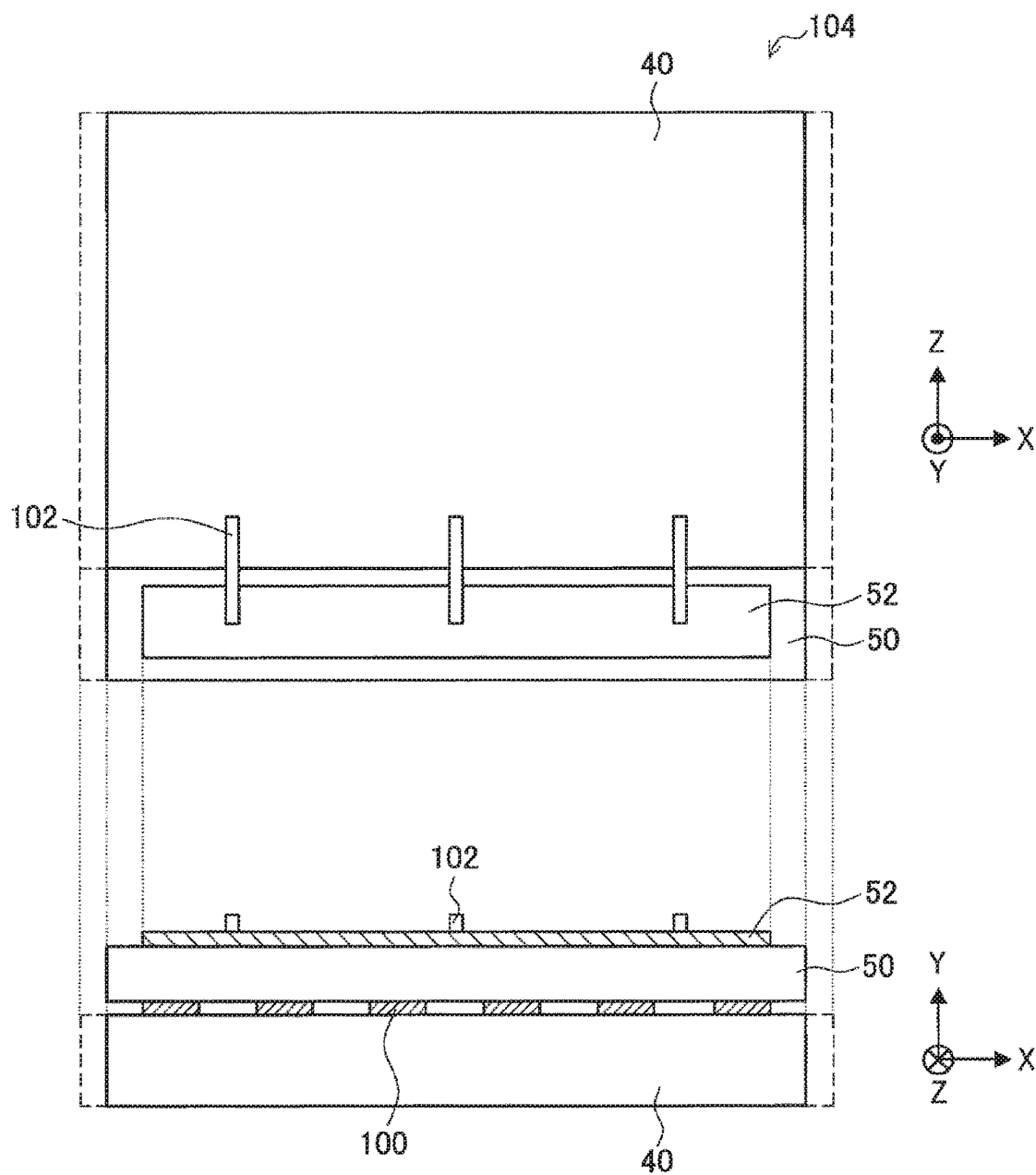
FIG. 6 is an explanatory diagram (part 2) for explaining the manufacturing step of the light-emitting module 30 according to the first embodiment of the present disclosure.
Figure 7:
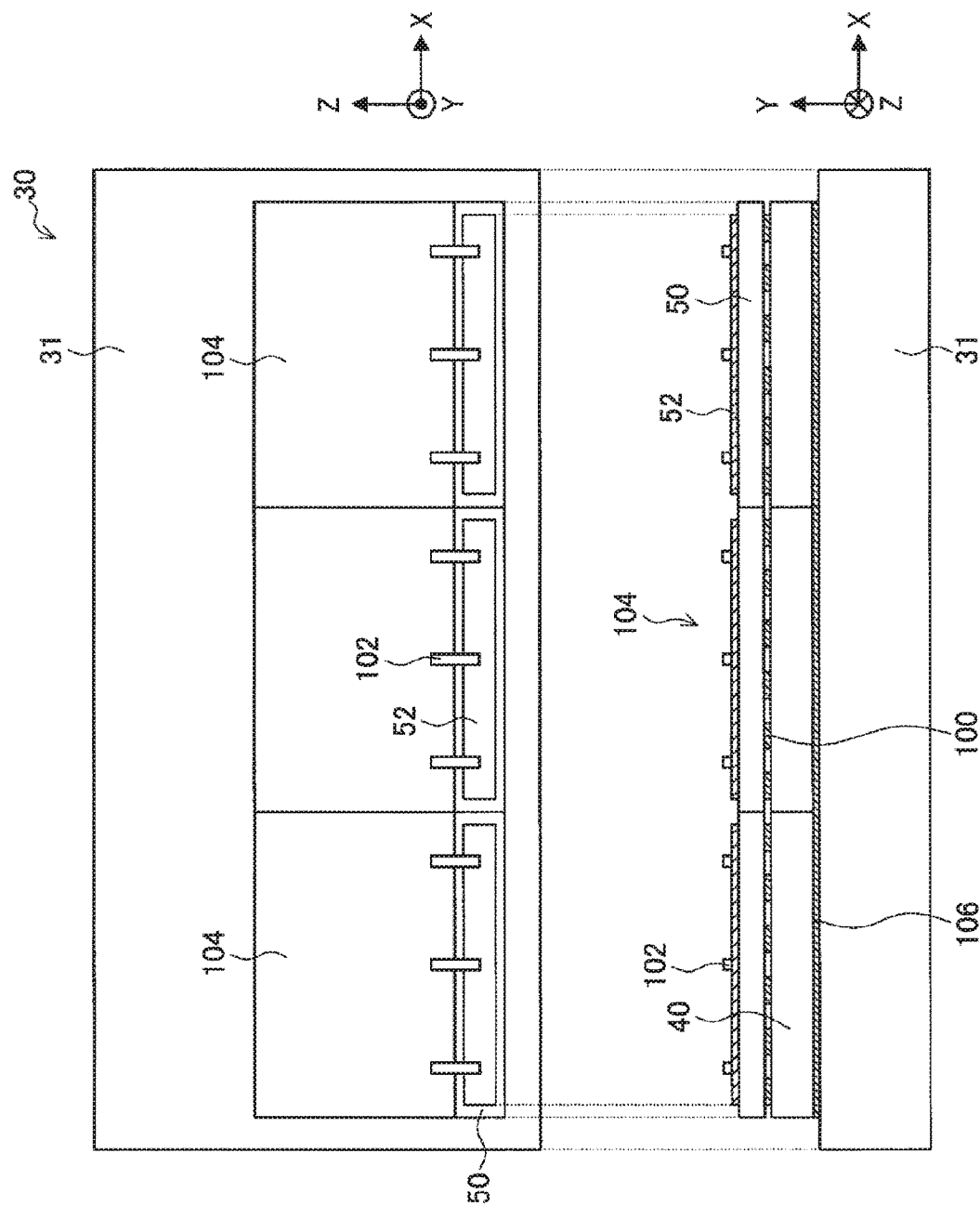
FIG. 7 is an explanatory diagram (part 3) for explaining the manufacturing step of the light-emitting module 30 according to the first embodiment of the present disclosure.
Figure 8:
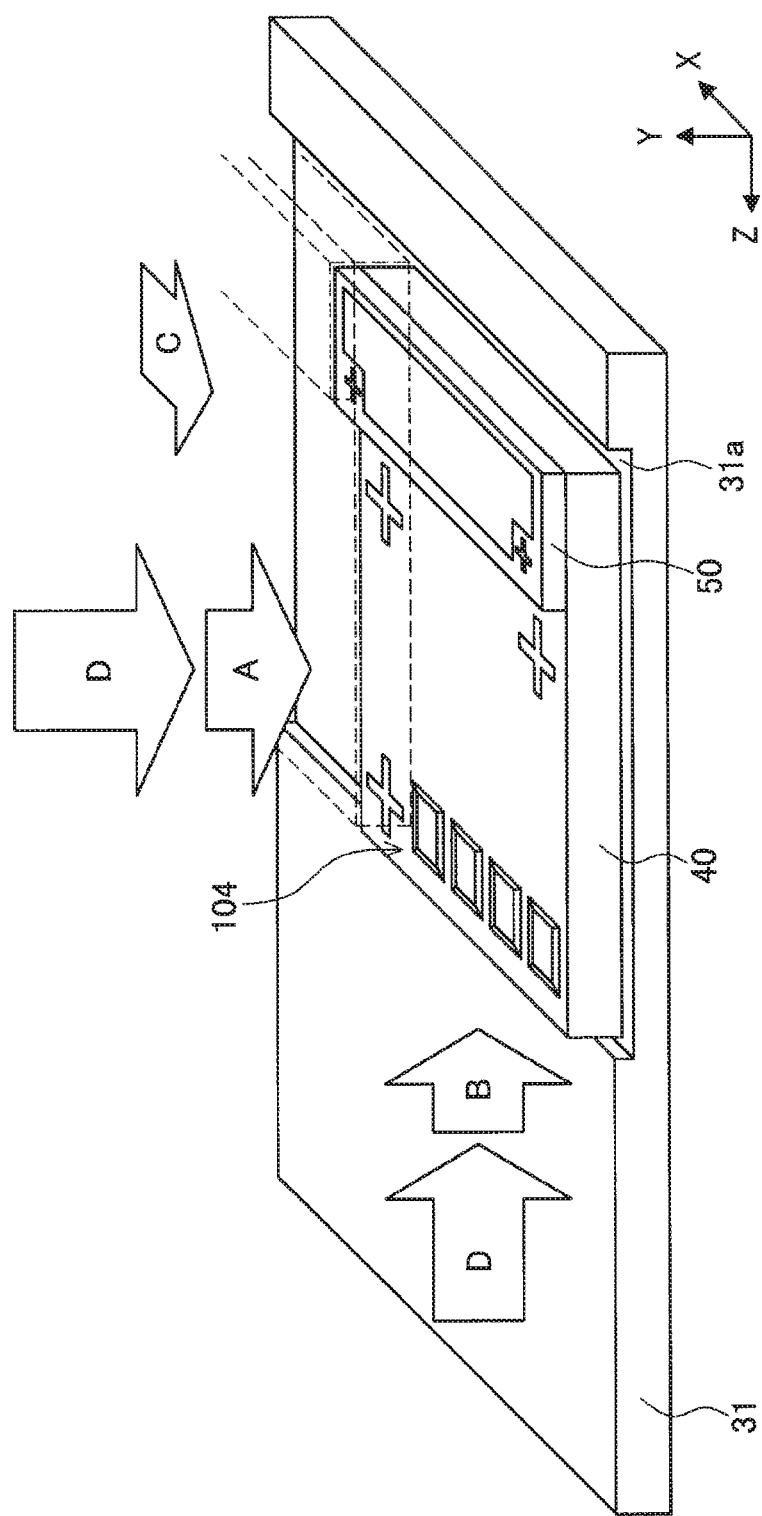
FIG. 8 is an explanatory diagram for explaining a method of manufacturing the light-emitting module 30 according to the first embodiment of the present disclosure.

First, a first embodiment of the present disclosure will be described with reference to FIGS. 5 to 8. FIGS. 5 to 7 are explanatory diagrams for explaining a manufacturing step of the light-emitting module according to the present embodiment. In detail, the upper part of each of FIGS. 5 to 7 illustrates a surface view of the sub-mount 40 or the driver IC 31, and the lower part of each of these figures illustrates a front view of the sub-mount 40 or the driver IC 31 viewed from the end face side from which light is emitted from each laser element 51. FIG. 8 is an explanatory diagram for explaining the method of manufacturing the light-emitting module according to the present embodiment, and in detail, is an explanatory diagram for explaining operation when a laminated body 104 is mounted on the driver IC 31.

First, in the present embodiment, as illustrated in FIG. 5, the multi-laser chip (light-emitting element array chip) 50 in which the plurality of laser elements 51 (not illustrated in FIG. 5) is formed is mounted on the sub-mount 40 such that the individual electrode 54 side faces the sub-mount (first circuit board) 40. Thus, when viewed from above the sub-mount 40, the common electrode 52 on the multi-laser chip 50 is visible. In detail, in the present embodiment, each individual electrode 54 of the multi-laser chip 50 is electrically connected to the sub-mount 40 by a conductive bump 100. Moreover, the common electrode 52 of the multi-laser chip 50 is electrically connected to the sub-mount 40 by a conductive wire 102. As illustrated in FIG. 5, the multi-laser chip 50 and the sub-mount 40 have different widths (widths in the X-axis direction) from each other, and in detail, these widths are different from the final finished width of the laminated body 104 including the multi-laser chip 50 and the sub-mount 40 described later. Moreover, the multi-laser chip 50 and the sub-mount 40 have different depths (lengths in the Z-axis direction) from each other, and the depth of the multi-laser chip 50 is shorter than the depth of the sub-mount 40. Thus, in the sub-mount 40 on which the multi-laser chip 50 is mounted, a part of the surface of the sub-mount 40 is exposed from the multi-laser chip 50.

Next, as illustrated in FIG. 6, dicing is performed so that the multi-laser chip 50 and the sub-mount 40 have the final finished width (width in the X-axis direction), and a laminated body (light-emitting element array) 104 is formed having highly accurate external dimensions. In the present embodiment, it is preferable to perform dicing with an accuracy that allows a deviation within about 1 to 2 μm.

Specifically, in the present embodiment, blade dicing using a blade or laser dicing using a laser can be used, but it is preferable to use plasma dicing. The plasma dicing is a dicing by chemical etching using an F-based gas, and it is possible not only to perform dicing with high accuracy, but also to avoid occurrence of chipping and cracking, so that it is more preferable to use the plasma dicing in the present embodiment.

Furthermore, after dicing, the cut surface of the laminated body 104 may be polished to form the laminated body 104 having external dimensions with higher accuracy. For example, in the present embodiment, chemical mechanical polishing (CMP) can be used as polishing. The CMP increases an effect of mechanical polishing by relative movement between a polishing agent and an object to be polished due to surface chemical action of the polishing agent itself or action of a chemical component contained in a polishing liquid, and a high-speed and smooth polishing surface can be obtained. Note that, in the present embodiment, the laminated body 104 may be formed by using polishing instead of dicing.

Next, in the present embodiment, as illustrated in FIG. 7, a plurality of the laminated bodies 104 is mounted on the driver IC (second circuit board) 31 to cause side surfaces facing the X-axis direction of the plurality of laminated bodies 104 having the same predetermined width with high accuracy by the dicing described above to be in contact with each other. In detail, the plurality of laminated bodies 104 is mounted on the driver IC 31 such that the end face (emission end face) that emits light of the laser element 51 in each laminated body 104 is arranged to be on the near side, and a side surface of one laminated body 104 abuts on a side surface of another laminated body 104. By doing so, since the width (width in the X-axis direction) of each laminated body 104 has a desired dimension accurately, over the plurality of laminated bodies 104, the interval (interval in the X-axis direction) between adjacent laser elements 51 can be made equal to the interval (interval in the X-axis direction) between the laser elements 51 in each laminated body 104. In other words, by doing so, in the light-emitting module 30, the plurality of laser elements 51 can be arranged on the driver IC 31 accurately in a line at predetermined intervals (for example, about 10 μm to 50 μm) along the X-axis direction (width direction). Note that, in the following description, unless otherwise specified, the side surface of the laminated body 104 means either or both of two surfaces extending along the Z-axis direction among the surfaces of the laminated body 104, in other words, two side surfaces having normal lines extending along the X direction.

Note that, fixing of the laminated body 104 to the driver IC 31 can be performed with a paste (thermoplastic paste) 106 having thermal plasticity, between the laminated body 104 and the driver IC 31. In detail, the paste 106 is a paste that is softened by heat and solidifies when cooled, and it is preferable to use a paste having high thermal conductivity to release heat generated by the laser element 51 and the like to the heat transfer plate 25 via the sub-mount 40 and the driver IC 31. For example, as the paste 106, silicon grease, silver paste, solder containing tin or the like can be mentioned. Since such a paste 106 has a characteristic of being softened by applying heat, the laminated body 104 once fixed to the driver IC 31 can be removed by applying heat. Thus, in the present embodiment, it is preferable to use such a paste 106 also from the viewpoint of rework. Note that, in the present embodiment, the laminated body 104 may be fixed at a predetermined position by utilizing a self-alignment effect of moving the laminated body 104 to a predetermined position due to surface adhesion when the paste 106 solidifies.

Moreover, in the present embodiment, by following a procedure illustrated in FIG. 8, the plurality of laminated bodies 104 can be accurately mounted on the driver IC 31. In detail, as illustrated in FIG. 8, a recessed portion 31a is provided in the driver IC 31 on which the laminated body 104 is mounted, and the laminated body 104 is arranged in the recessed portion 31a. At this time, by arranging the laminated body 104 such that the end face that emits light of the laser element 51 of the laminated body 104 comes in contact with an inner side surface of the recessed portion 31*a* positioned on the convergent rod lens 22 side, the position in the Z-axis direction of the laminated body 104 can be aligned. By doing so, the plurality of laminated bodies 104 can be mounted on the driver IC 31 while the emission end faces of the plurality of laminated bodies 104 from which light is emitted are aligned flush.

Specifically, in the present embodiment, the laminated body 104 is mounted on the driver IC, and as illustrated by an arrow A in FIG. 8, the laminated body 104 is pressed from above (along the Y-axis direction) with a weak force. By doing so, floating of the laminated body 104 from the driver IC 31 is prevented.

Next, as illustrated by an arrow B in FIG. 8, the laminated body 104 is pressed with a weak force toward the convergent rod lens 22 side along the Z-axis direction such that the above-described emission end face of the laminated body 104 comes in contact with the inner side surface of the convergent rod lens 22 side of the recessed portion 31*a*. By doing so, the above-described emission end face from which light is emitted of the laminated body 104 is aligned at a predetermined position.

Then, in the present embodiment, as illustrated by an arrow C in FIG. 8, the laminated body 104 is pressed with a strong force along the X-axis direction to cause the side surface facing the X-axis direction of the laminated body 104 to be in contact with the side surface facing the X-axis direction of another laminated body 104 already mounted. By doing so, the laminated bodies 104 can be accurately arranged on the driver IC 31 along the X-axis direction.

Moreover, in the present embodiment, as illustrated by an arrow D in FIG. 8, the laminated body 104 is pressed with a strong force from above and toward the convergent rod lens 22 side along the Z-axis direction. By doing so, the plurality of laminated bodies 104 can be accurately mounted at predetermined positions while the above-described emission end faces of the plurality of laminated bodies 104 are aligned flush.

Note that, in the present embodiment, it is not limited to perform mounting in the procedure as described above, and the force may be applied to the laminated body 104 in another order, or the strength of the force may be changed. Furthermore, in the procedure described above, the force applied to the laminated body 104 along the Y-axis direction and the Z-axis direction is applied in two stages by changing the strength of the force, but the present embodiment is not limited to this, and the force may be applied in one stage.

As described above, in the present embodiment, the light-emitting module 30 is manufactured. According to the present embodiment, the plurality of laser elements 51 can be accurately arranged at narrow intervals.

Note that, in the above description, the description has been made assuming that the widths (widths in the X-axis direction) of the plurality of laminated bodies 104 are the same as each other, but the present embodiment is not limited to this. For example, in the present embodiment, the widths (widths in the X-axis direction) of the plurality of laminated bodies 104 may be different from each other as long as the plurality of laser elements 51 can be arranged accurately in a line at predetermined intervals along the X-axis direction (width direction) by mounting the plurality of laminated bodies 104 on the driver IC 31 to cause the side surfaces of the plurality of laminated bodies 104 to be in contact with each other.

Furthermore, in the present embodiment, as described above, the laminated body 104 may be directly mounted on the heat transfer plate 25 without interposing the driver IC 31. In this case, in the method of manufacturing the light-emitting module 30 described above, the driver IC 31 is replaced with the heat transfer plate 25. Moreover, in the present disclosure, the laminated body 104 may include only the multi-laser chip 50, and in this case, the laminated body 104 may be directly mounted on the driver IC 31, or may be directly mounted on the heat transfer plate 25.

<4.2 Light-Emitting Module 30>

The light-emitting module 30 manufactured by the manufacturing method described above includes: the plurality of laminated bodies (light-emitting element arrays) 104 each including the multi-laser chip 50 including the plurality of laser elements 51 arranged along the X-axis direction (width direction) and the sub-mount 40; and the driver IC (substrate) 31 on which the plurality of laminated bodies 104 is mounted. Moreover, in the light-emitting module 30, the plurality of laminated bodies 104 is mounted on the driver IC 31 such that the side surfaces of the laminated bodies 104 adjacent to each other along the X-axis direction come in contact with each other, whereby the plurality of laser element 5 is accurately arranged at predetermined intervals along the X-axis direction.

<4.3 Method of Manufacturing Light Source Unit 20>

Subsequently, a method will be briefly described of manufacturing the light source unit 20 according to the present embodiment.

First, the light-emitting module 30 manufactured as described above and the glass epoxy substrate 24 provided with the connector 23 are mounted on the heat transfer plate 25. Moreover, connection is made by wire bonding between the light-emitting module 30 (driver IC 31) and the glass epoxy substrate 24.

Next, the heat transfer plate 25 on which the light-emitting module 30 and the glass epoxy substrate 24 are mounted is fixed on the second base 27 with an adhesive having a high thermal conductivity interposed therebetween. This fixing is performed by screwing, but the screwing is performed not on the light-emitting module 30 side but on the glass epoxy substrate 24 side.

Subsequently, the first base 26 and the second base 27 are fixed to each other by screwing. Then, the convergent rod lens 22 is fixed to the opening of the housing 21 formed by the groove portion 26*a* of the first base 26 and the groove portion 27*a* of the second base 27. At the time of the fixing, a position of the convergent rod lens 22 with respect to the light-emitting module 30 is adjusted to improve the accuracy of an image forming position by the convergent rod lens 22, and then the convergent rod lens 22 is temporarily fixed to the housing 21 with an ultraviolet curable adhesive or the like.

Moreover, the gap between the first base 26 and the second base 27, the gap between the housing 21 and the convergent rod lens 22, and the gap between the housing 21 and the connector 23 are sealed with an adhesive or the like. Finally, the cooling mechanism 80 is screwed to the housing 21 (the second base 27). As described above, the light source unit 20 according to the present embodiment is manufactured.

5. SECOND EMBODIMENT

Figure 9:
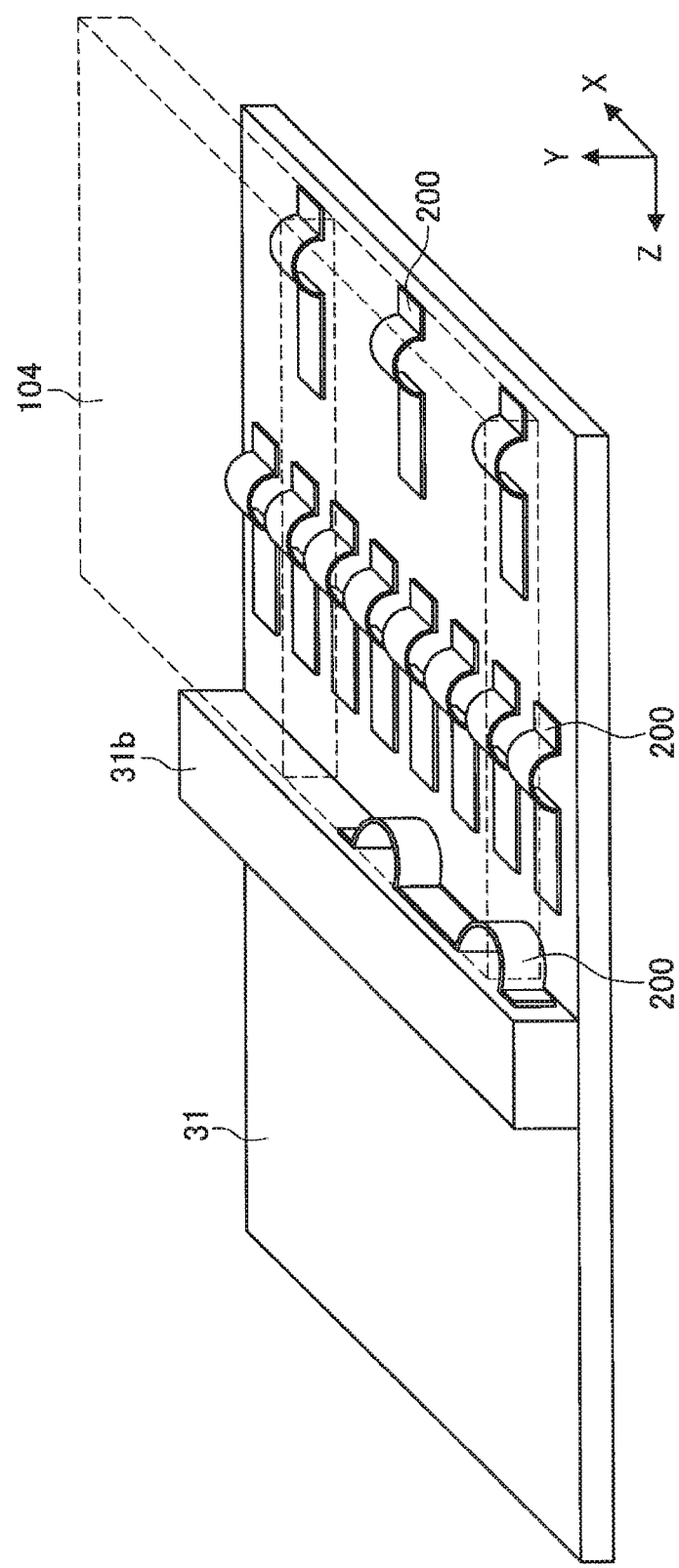
FIG. 9 is an explanatory diagram for explaining a method of manufacturing the light-emitting module 30 according to a second embodiment of the present disclosure.

By the way, as described above, in the manufacturing step of the light-emitting module 30, a defect may occur in the laser element 51, or a defect may occur in the laser element 51 due to degradation over time by use of the light-emitting module 30. To cope with such a case, it is preferable that only the laminated body 104 including a defective laser element 51 can be easily replaced even after the light-emitting module 30 and the light source unit 20 are assembled. Thus, as a second embodiment of the present disclosure, an embodiment will be described in which the laminated body 104 can be easily replaced as compared to the first embodiment described above, with reference to FIG. 9. FIG. 9 is an explanatory diagram for explaining the method of manufacturing the light-emitting module 30 according to the present embodiment, and in detail, is a perspective view of the driver IC 31 on which the laminated body 104 is mounted.

In the present embodiment, unlike the first embodiment, the laminated body 104 described above is not fixed to the driver IC 31 with the paste 106, and fixing is performed, for example, by sandwiching the plurality of laminated bodies 104 mounted at desired positions of the driver IC 31 by the base 26 and the base 27 of the housing 21 of the light source unit 20. In the present embodiment, by doing so, a desired laminated body 104 can be easily replaced since it is not fixed with the paste 106.

However, as described above, since the laser element 51 provided in the laminated body 104 generates high heat, it is required to ensure the contact between the laminated body 104 and the driver IC 31 to exhaust heat. Thus, in the present embodiment, an embodiment is devised in which the desired laminated body 104 can be easily replaced and the contact between the laminated body 104 and the driver IC 31 can be ensured.

In detail, a plurality of urging members 200 is provided on a surface on which the laminated body 104 is mounted of the driver IC 31 according to the present embodiment. The urging members 200 each are a leaf spring including heat conductive material such as a metal having high thermal conductivity, for example, copper or the like, and come in contact with the side surface and the bottom surface of the laminated body 104 by using the urging force. Thus, in the present embodiment, the contact between the laminated body 104 and the driver IC 31 is ensured via the urging members 200, and the heat generated by the laser element 51 of the laminated body 104 can be exhausted to the heat transfer plate 25 via the driver IC 31. Note that, the side surface of the laminated body 104 that comes in contact with the urging member 200 described above means either or both of two surfaces extending along the Z-axis direction among the surfaces of the laminated body 104, in other words, two side surfaces having normal lines extending along the X direction. Moreover, the side surface of the laminated body 104 that comes in contact with the urging member 200 described above may be a surface facing the emission end face described above.

Specifically, as illustrated in FIG. 9, the urging member 200 is a leaf spring partially curved in a semicircular shape, and is connected to the driver IC 31 in a non-curved portion. On the other hand, the apex of a curved portion of the urging member 200 presses the laminated body 104 using the urging force, whereby the contact can be ensured between the laminated body 104 and the driver IC 31. Such an urging member 200 is formed as one type of micro electro mechanical systems (MEMS) components, and can be formed by using various film forming technologies and etching technologies used in the manufacturing of semiconductor devices.

More specifically, the urging member 200 is a leaf spring having a width of about 5 to 10 µm, and the radius of a semicircle formed by the curved portion is about 5 to 10 µm. Note that, in FIG. 9, the curved portion is illustrated as being hollow, but in the present embodiment, the curved portion may be filled with a soft resin or the like. Moreover, in the present embodiment, as illustrated in FIG. 9, the surface on which the laminated body 104 is mounted of the driver IC 31 may be provided with a protruding portion 31b protruding upward, and the urging member 200 described above may be provided on a side surface of the protruding portion 31b.

Note that, in the present embodiment, the urging member 200 is not limited to the form illustrated in FIG. 9, and may have another form and size, or may include resin or the like.

As described above, according to the present embodiment, by providing the urging member 200 on the surface on which the laminated body 104 is mounted of the driver IC 31, the desired laminated body 104 can be easily replaced as necessary while the contact is ensured between the laminated body 104 and the driver IC 31.

6. THIRD EMBODIMENT

Figure 10:
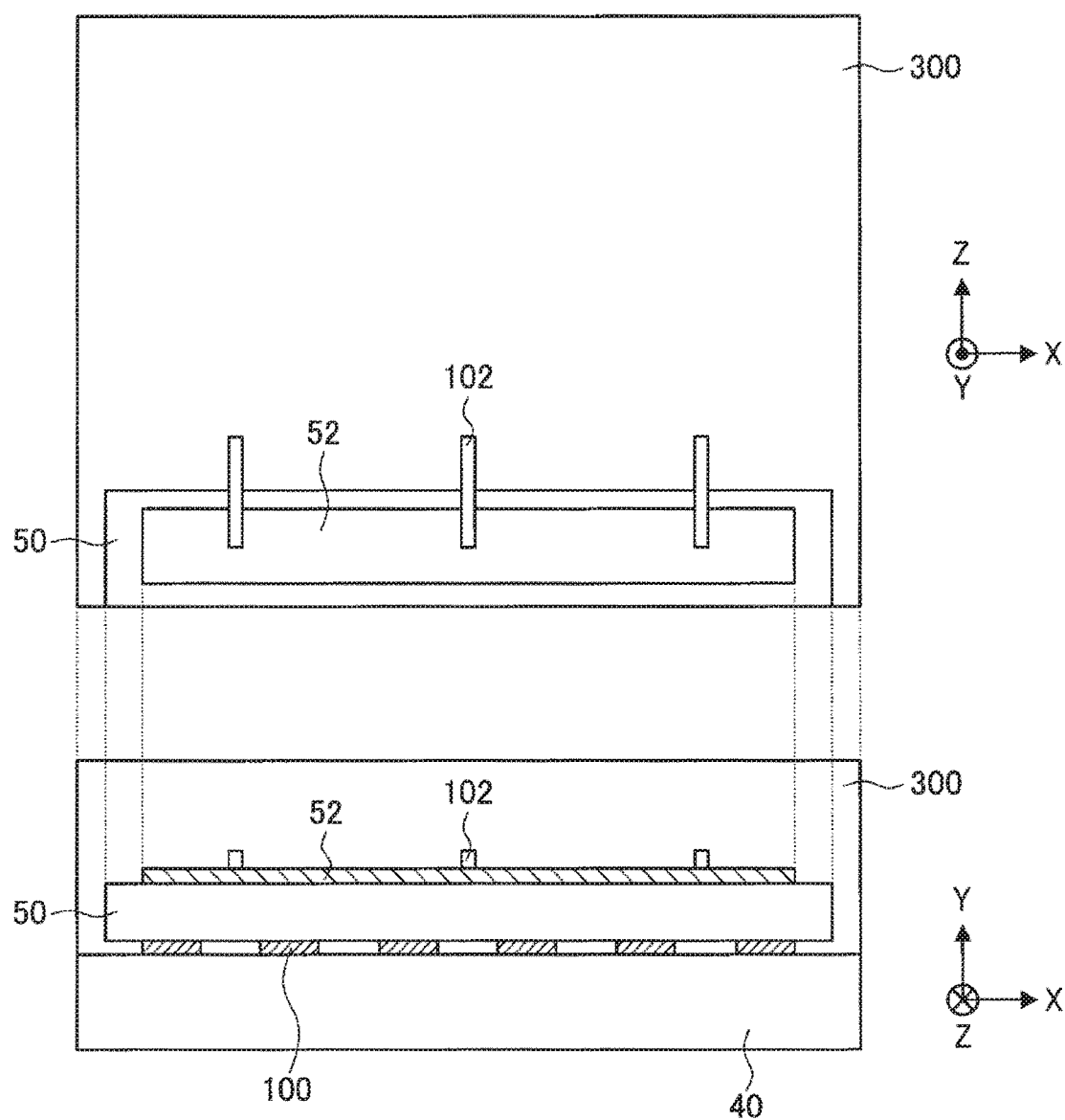
FIG. 10 is an explanatory diagram (part 1) for explaining a manufacturing step of a light-emitting module 30a according to a third embodiment of the present disclosure.
Figure 11:
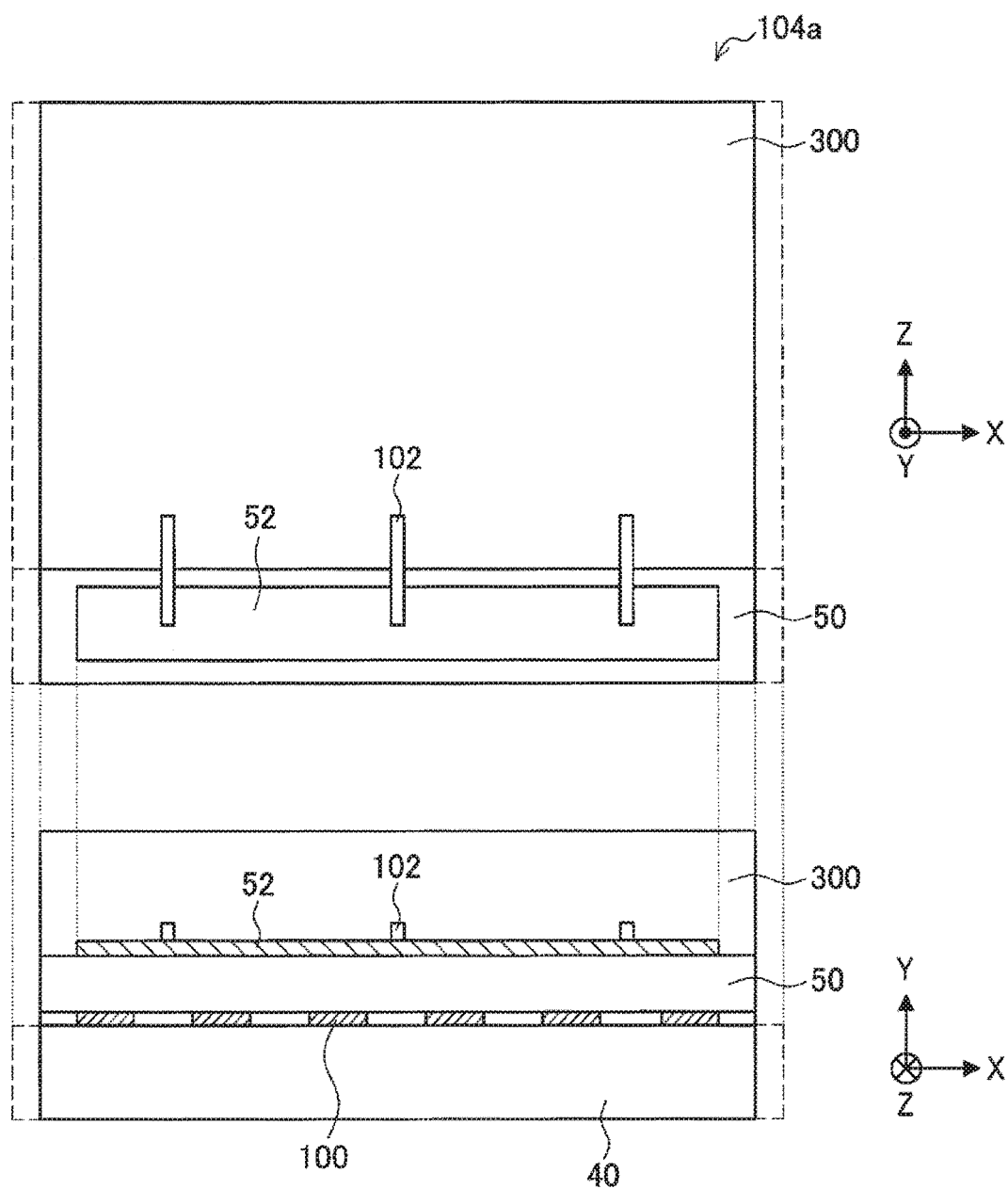
FIG. 11 is an explanatory diagram (part 2) for explaining the manufacturing step of the light-emitting module 30a according to the third embodiment of the present disclosure.
Figure 12:
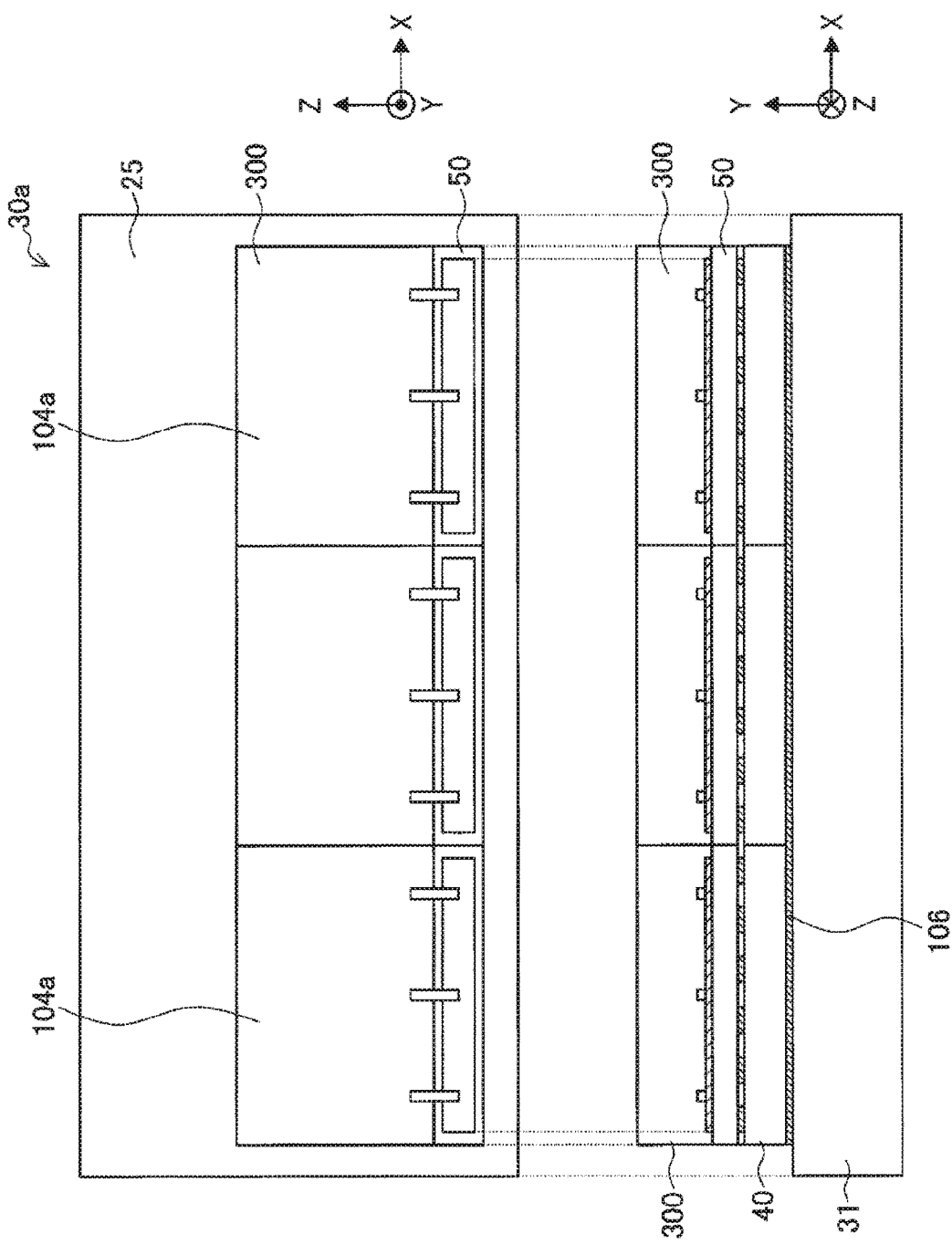
FIG. 12 is an explanatory diagram (part 3) for explaining the manufacturing step of the light-emitting module 30a according to the third embodiment of the present disclosure.

In the present disclosure, the laminated body 104 according to the first embodiment described above may be covered with resin, glass, or the like. Thus, as a third embodiment of the present disclosure, an embodiment will be described in which the laminated body 104 is covered with resin, glass, or the like, with reference to FIGS. 10 to 12. FIGS. 10 to 12 are explanatory diagrams for explaining a manufacturing step of a light-emitting module 30a according to the present embodiment. In detail, the upper part of each of FIGS. 10 to 12 illustrates a surface view of the sub-mount 40 or the driver IC 31, and the lower part of each of these figures illustrates a front view of the sub-mount 40 or the driver IC 31 viewed from the end face side from which light is emitted from each laser element 51. Note that, in these figures, it is assumed that a laminated body 104a is covered with a transparent resin 300.

First, also in the present embodiment, as illustrated in FIG. 5 of the first embodiment described above, the multi-laser chip 50 in which the plurality of laser elements 51 (not illustrated in FIG. 10) is formed is mounted on the sub-mount 40 such that the individual electrode 54 side faces the sub-mount 40. Next, in the present embodiment, as illustrated in FIG. 10, the surfaces of the multi-laser chip 50 and the sub-mount 40 are covered with the resin 300. At this time, not to hinder emission of light from the laser element 51 of the multi-laser chip 50, the resin 300 covers only the surface of the multi-laser chip 50 and the sub-mount 40 not to cover the end face from which the light is emitted. Note that, in the present embodiment, the resin 300 may be glass, and is not particularly limited. Furthermore, the resin 300 is not limited to a transparent material.

By covering the surfaces of the multi-laser chip 50 and the sub-mount 40 with the resin 300 in this way, the surfaces of the multi-laser chip 50 and the sub-mount 40 are protected by the resin 300 when the laminated body 104a is replaced as rework, so that handling of the laminated body 104a is facilitated.

Note that, the widths of the multi-laser chip 50, the sub-mount 40, and the resin 300 in the X-axis direction are different from the final finished width of the laminated body 104a.

Next, as illustrated in FIG. 11, the side surfaces of the multi-laser chip 50, the sub-mount 40, and the resin 300 are polished to have the final finished width (X-axis direction), so that the laminated body 104a is formed having a highly accurate width dimension. For example, the CMP described above can be mentioned as a polishing method. Moreover, in the present embodiment, the laminated body 104a may be provided with a marker pattern (not illustrated) that gives a notification, when the laminated body 104a reaches a desired width, of that fact. By doing so, the polishing is performed, and the polishing is stopped when the marker pattern appears, whereby the laminated body 104a can be obtained having a highly accurate width dimension.

Alternatively, in the present embodiment, the laminated body 104a may be provided with a hard-to-polish material indicating a polishing stop position, as a polishing stopper film (not illustrated) (stopper layer). The hard-to-polish material is, for example, a material that is difficult to polish as compared to the multi-laser chip 50 and the sub-mount 40 including a silicon substrate, and the resin 300, and specifically, tungsten or the like can be mentioned. In the present embodiment, a stopper film including such a material is provided to the laminated body 104a to determine the polishing stop position (end point). According to the present embodiment, such a stopper film appears on the surface as polishing proceeds, and the polishing speed changes, so that the polishing stop position can be easily detected. As a result, according to the present embodiment, the laminated body 104a can be obtained having a highly accurate width dimension.

Next, in the present embodiment, as illustrated in FIG. 12, similarly to the first embodiment, the plurality of laminated bodies 104 is mounted on the driver IC 31 to cause the side surfaces of the plurality of laminated bodies 104a each having a highly accurate width dimension by the polishing described above to be in contact with each other. By doing so, over the plurality of laminated bodies 104a, the interval between adjacent laser elements 51 can be made equal to the interval between the laser elements 51 in each laminated body 104a. As described above, the light-emitting module 30a according to the present embodiment can be manufactured.

Furthermore, in the present embodiment, as described above, since the surfaces of the multi-laser chip 50 and the sub-mount 40 are covered with the resin 300, and these surfaces are protected by the resin 300, handling of the laminated body 104a is facilitated during rework.

7. FOURTH EMBODIMENT

<7.1 Method of Manufacturing Light-Emitting Module 30>

Figure 13:
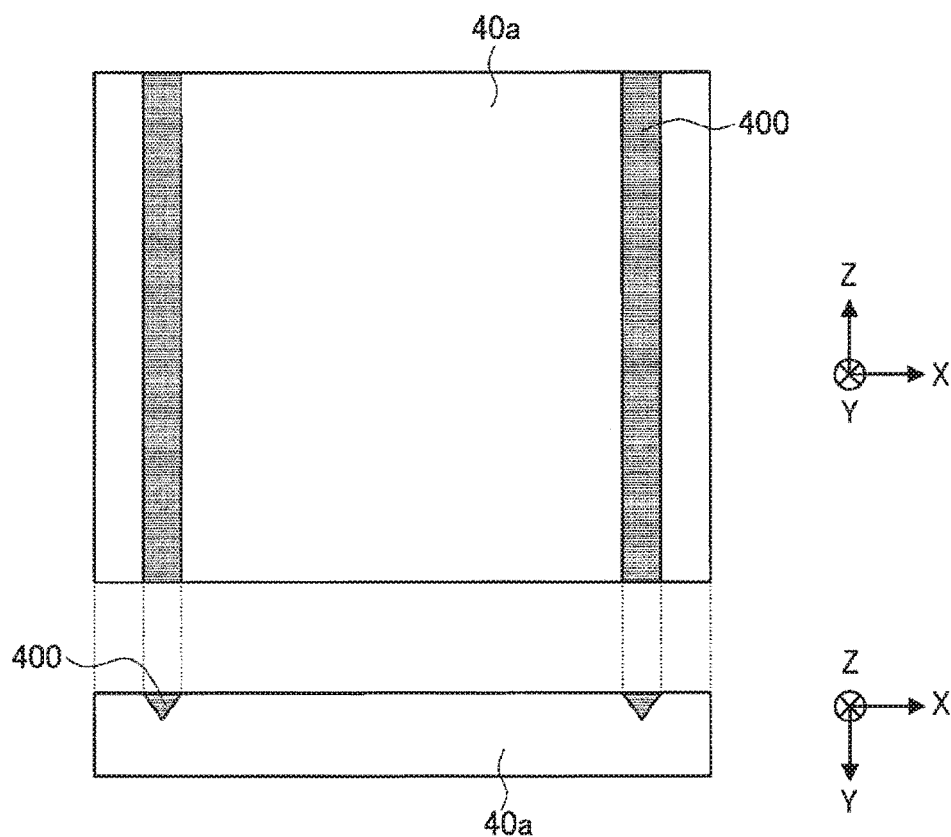
FIG. 13 is an explanatory diagram for explaining a method of manufacturing a light-emitting module 30b according to a fourth embodiment of the present disclosure.

Furthermore, in the present disclosure, a plurality of laminated bodies 104b may be mounted at a predetermined position of the driver IC 31 by forming a positioning element for positioning on the back surface of a sub-mount 40a, and causing the positioning element to engage with another positioning element provided on the surface of the driver IC 31. Hereinafter, such an embodiment will be described as a fourth embodiment of the present disclosure with reference to FIG. 13. FIG. 13 is an explanatory diagram for explaining a method of manufacturing the light-emitting module 30 according to the present embodiment, and is an explanatory diagram for explaining the back surface of the sub-mount 40a according to the present embodiment. In detail, the upper part of FIG. 13 illustrates a back view of the sub-mount 40a, and the lower part of FIG. 13 illustrates a front view of the sub-mount 40a viewed from the end face side from which light is emitted from each laser element 51. Note that, in FIG. 13, the vertical relationship in the figure is reversed from that in FIGS. 2 and 3.

In the present embodiment, a first positioning portion 400 is provided on a surface facing the driver IC31 of the sub-mount 40, and a second positioning portion (not illustrated) is provided on a surface facing the sub-mount 40 (the laminated body 104b) of the driver IC31. Then, in the present embodiment, the first positioning portion 400 and the second positioning portion are caused to engage with each other, whereby the sub-mount 40, in other words, the laminated body 104b can be mounted at a desired position on the driver IC 31. As a result, according to the present embodiment, in the light-emitting module 30, the plurality of laser elements 51 can be accurately arranged at predetermined intervals along the X-axis direction (width direction). Note that, the laminated body 104b of the present embodiment has a configuration similar to that of the laminated body 104 according to the first and third embodiments described above, but compared to these embodiments, a width in the X-axis direction is allowed even when there is a shift somewhat.

In detail, in the present embodiment, as illustrated in FIG. 13, a groove 400 having a V-shape is formed as the first positioning portion on the back surface of the sub-mount 40a. As illustrated in FIG. 13, the groove 400 is a groove extending from one end to the other end in the Z-axis direction of the sub-mount 40a along the Z-axis direction, and two grooves are provided on the back surface of the sub-mount 40a. Moreover, the groove 400 has the V-shape in a case where the sub-mount 40a is viewed from the end face side from which light is emitted from each laser element 51.

Specifically, in a case where the sub-mount 40 includes a silicon substrate, the groove 400 having the V-shape can be easily formed by utilizing anisotropy of wet etching. In detail, in the present embodiment, the back surface of the sub-mount 40 is the 001 plane of silicon, and a silicon oxide film or the like is formed as a mask in a region of the back surface where the groove 400 is not to be formed. Moreover, in the present embodiment, by performing wet etching on the back surface described above, the 111 plane of silicon is exposed, and the groove 400 having the V-shape, which has an apex on the lower side, can be easily formed. Note that, the method of forming the groove 400 is not limited to the method described above, and the groove 400 may be formed by various directions by combining photolithography with etching or the like.

Moreover, at a predetermined position of the driver IC 31, for example, a protrusion having a V-shape (not illustrated), which has an apex on the upper side and can engage with the groove 400 described above, is formed as the second positioning portion. Moreover, by mounting the laminated body 104 on the driver IC 31 such that the protrusion and the groove 400 described above engage with each other, the plurality of laminated bodies 104b can be mounted at desired positions on the driver IC 31. As a result, in the present embodiment, the plurality of laser elements 51 included in each of the laminated bodies 104b can be accurately arranged at desired intervals along the X-axis direction (width direction) over the light-emitting module 30.

Note that, in the present embodiment, the cross sections of the groove 400 and the protrusion are not limited to the V-shape, and may have another form.

Furthermore, in the present embodiment, as described above, the laminated body 104b may be directly mounted on the heat transfer plate 25 without interposing the driver IC31. In this case, in the method of manufacturing the light-emitting module 30 described above, the driver IC 31 is replaced with the heat transfer plate 25. Moreover, in the present disclosure, the laminated body 104b may include only the multi-laser chip 50, and in this case, the groove 400 as described above is formed on the back surface of the multi-laser chip 50.

<7.2 Modifications>

Note that, in the present embodiment, the form of the groove 400 is not particularly limited, and can be variously modified. Hereinafter, modifications will be described of the groove 400 according to the present embodiment with reference to FIGS. 14 to 18. FIGS. 14 to 18 are explanatory diagrams for explaining a method of manufacturing the light-emitting module 30 according to Modifications 1 to 5 of the present embodiment, and in detail, each illustrate a back view of the sub-mount 40*a*. Note that, in the following description of the modification, only the groove 400 formed on the back surface of the sub-mount 40*a* will be described; however, actually, in each modification, it is assumed that a protrusion is provided that can engage with the groove 400 according to the modification at a corresponding position on the surface of the driver IC 31.

(Modification 1)

Figure 14:
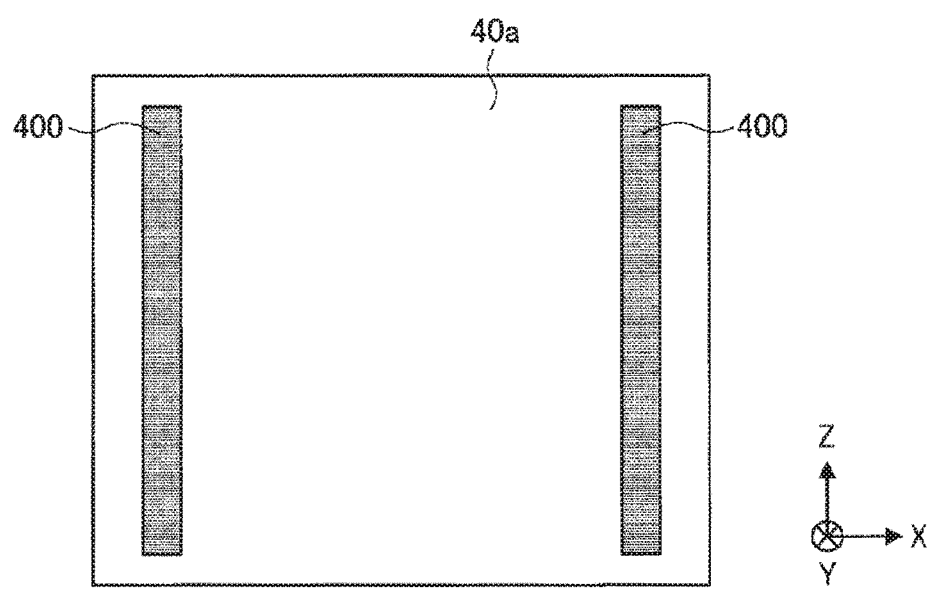
FIG. 14 is an explanatory diagram for explaining a method of manufacturing the light-emitting module 30b according to Modification 1 of the fourth embodiment of the present disclosure.

In Modification 1, as illustrated in FIG. 14, similarly to the above-described embodiment, two grooves 400 extending along the Z-axis direction are provided on the back surface of the sub-mount 40*a*. However, unlike the present embodiment, the groove 400 according to Modification 1 does not extend from one end to the other end of the back surface of the sub-mount 40*a*, but is provided to extend over only a central region of the back surface not to extend to the end of the sub-mount 40*a*. According to the present modification, by providing such two grooves 400, it is possible not only to perform alignment in the X-axis direction of the plurality of laminated bodies 104*b*, but also to prevent a displacement in the Y-axis direction.

(Modification 2)

Figure 15:
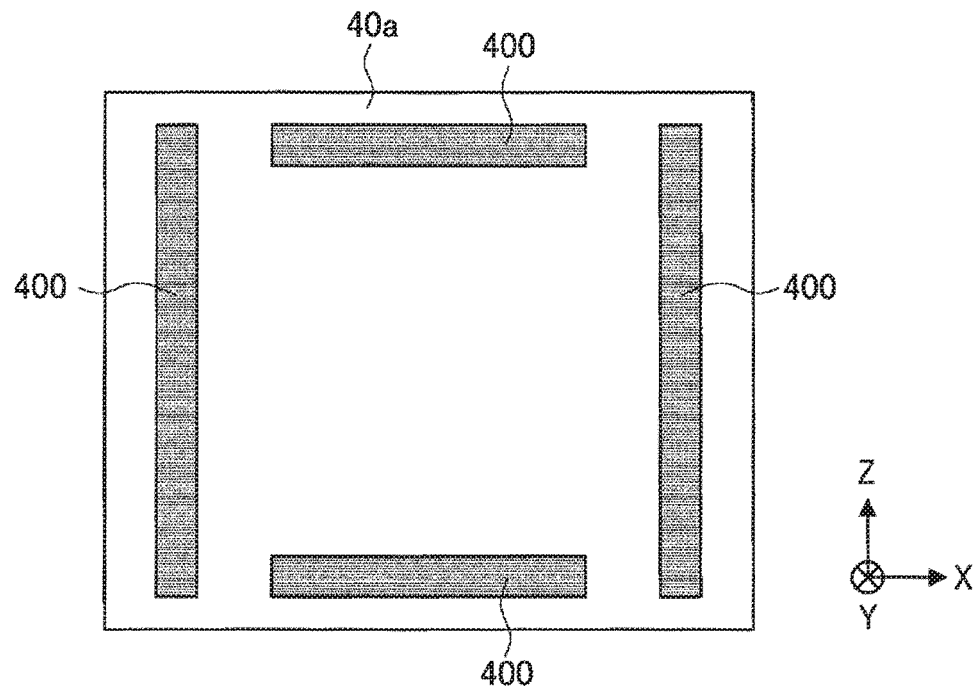
FIG. 15 is an explanatory diagram for explaining a method of manufacturing the light-emitting module 30b according to Modification 2 of the fourth embodiment of the present disclosure.

In Modification 2, as illustrated in FIG. 15, unlike Modification 1 described above, four grooves 400 are provided on the back surface of the sub-mount 40*a*. In detail, in Modification 2, two grooves 400 extending along the Z-axis direction are provided similarly to Modification 1, and two grooves 400 extending along the X-axis direction are further provided. According to the present modification, by providing such four grooves 400, it is possible to control positions not only in the X-axis direction but also in the Y-axis direction, of the plurality of laminated bodies 104*b*.

(Modification 3)

By the way, since the laser element 51 provided on the laminated body 104*b* generates heat as described above, it is preferable that the heat generated by the laser element 51 is efficiently exhausted to the heat transfer plate 25 via the sub-mount 40*a* and the driver IC31. Thus, to efficiently exhaust heat, it is preferable to increase an area where the back surface of the sub-mount 40*a* of the laminated body 104*b* and the surface of the driver IC 31 are in contact with each other, and it is preferable that the contact portion exists uniformly over the entire back surface of the sub-mount 40*a*.

Figure 16:
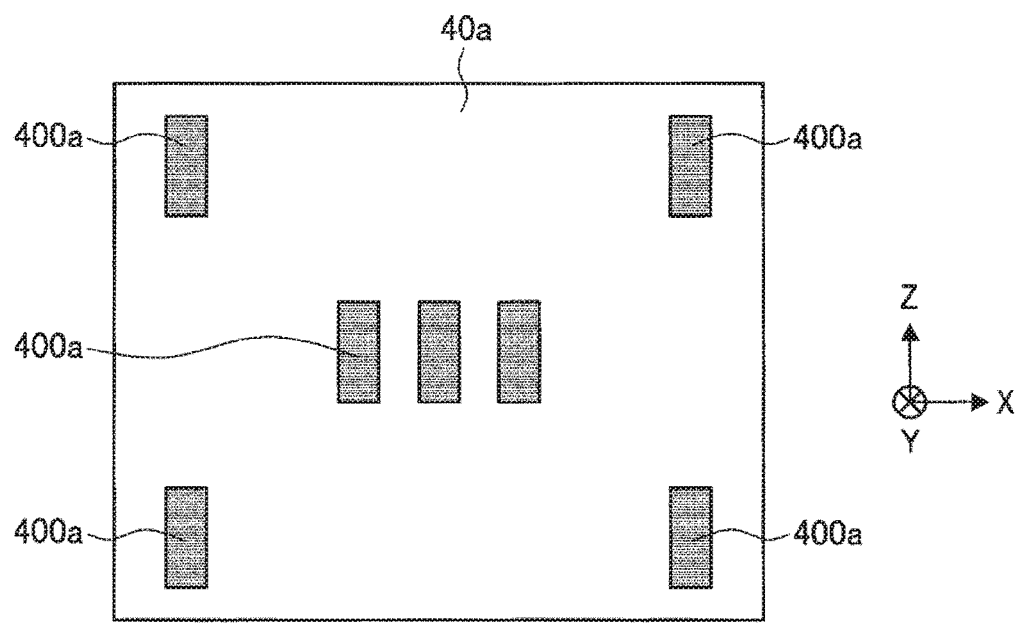
FIG. 16 is an explanatory diagram for explaining a method of manufacturing the light-emitting module 30b according to Modification 3 of the fourth embodiment of the present disclosure.

Thus, in Modification 3, by providing a plurality of grooves 400*a* having a shorter length than the groove 400 according to the above-described embodiment over the entire back surface of the sub-mount 40*a*, it is possible to mount the plurality of laminated bodies 104*b* at desired positions on the driver IC 31 while maintaining a large area where the back surface of the sub-mount 40*a* and the surface of the driver IC 31 are in contact with each other. In detail, in Modification 3, as illustrated in FIG. 16, the grooves 400*a*, each of which has a shorter length than the groove 400 according to the above-described embodiment and extends along the Z-axis direction, are provided at the central portion and near the four corners of the back surface of the sub-mount 40*a*.

(Modification 4)

Figure 17:
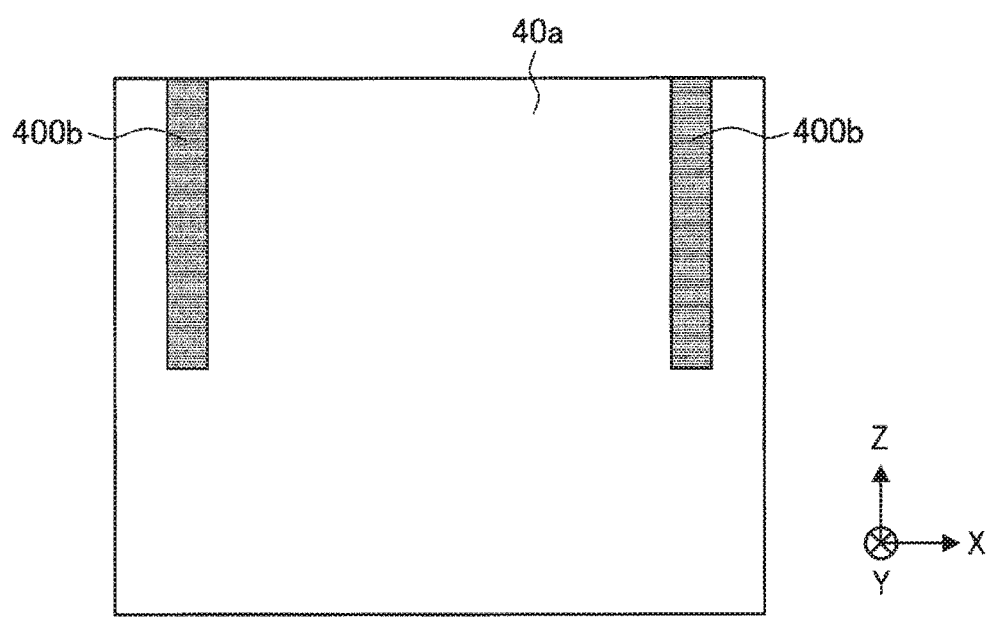
FIG. 17 is an explanatory diagram for explaining a method of manufacturing the light-emitting module 30b according to Modification 4 of the fourth embodiment of the present disclosure.

Furthermore, from the viewpoint of heat exhaust, it is preferable that the contact between the back surface of the sub-mount 40*a* of the laminated body 104*b* and the surface of the driver IC 31 is ensured particularly below the laser element 51 that generates heat. Thus, in Modification 4, as illustrated in FIG. 17, on the back surface of the sub-mount 40*a*, two grooves 400*b* are provided each having a shorter length than the groove 400 according to the above-described embodiment and extending along the Z-axis direction. In detail, the groove 400*b* extends from an end positioned on the connector 23 side in the Z-axis direction of the sub-mount 40*a* to the central region of the back surface. In other words, the groove 400*b* does not extend to an end on the end face side from which light is emitted from the laser element 51 of the sub-mount 40*a*. According to the present modification, by providing such a groove 400*b*, the contact between the back surface of the sub-mount 40*a* and the surface of the driver IC 31 is ensured below the laser element 51. As a result, according to the present modification, it is possible to mount the plurality of laminated bodies 104*b* at desired positions on the driver IC 31 while enabling efficient heat exhaust.

(Modification 5)

Furthermore, in the above-described embodiment and Modifications 1 to 4, it has been described that the groove 400 is provided extending mainly along the Z-axis direction: however, the present embodiment is not limited to such a groove 400. For example, in the present embodiment, only a groove 400*c* extending along the X-axis direction may be provided on the back surface of the sub-mount 40*a* of the laminated body 104*b*. Thus, such a form will be described as Modification 5 of the present embodiment with reference to FIG. 18. Note that, it is assumed that the laminated body 104*b* of the present modification has a predetermined width with high accuracy, similarly to the laminated body 104 according to the first and third embodiments described above.

Figure 18:
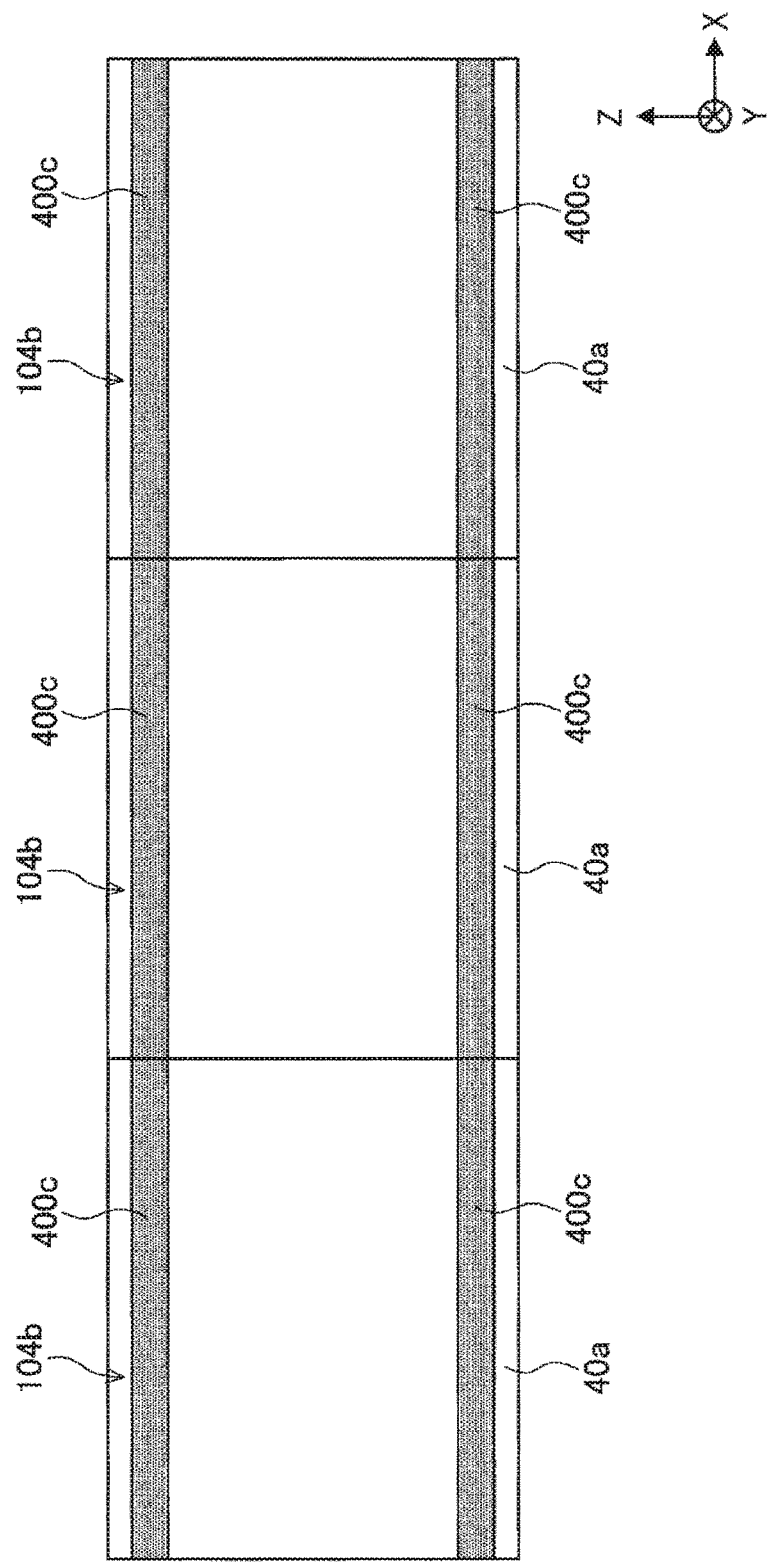
FIG. 18 is an explanatory diagram for explaining a method of manufacturing the light-emitting module 30b according to Modification 5 of the fourth embodiment of the present disclosure.

In detail, in the present modification, as illustrated in FIG. 18, on the back surface of the sub-mount 40*a* of each laminated body 104*b*, two grooves 400*c* are provided extending from one end to the other end in the X-axis direction of the sub-mount 40*a* along the X-axis direction. In the present modification, when the plurality of laminated bodies 104*b* is mounted on the driver IC 31, similarly to the first embodiment, the plurality of laminated bodies 104 is mounted on the driver IC 31 to cause the side surfaces facing the X-axis direction of the plurality of laminated bodies 104*b* to be in contact with each other. In other words, in the present modification, positioning of the laminated body 104*b* in the X-axis direction is performed similarly to the first embodiment. Moreover, in the present modification, the groove 400*c* on the back surface of the sub-mount 40*a* of each laminated body 104*b* is caused to engage with the above-described protrusion (not illustrated) provided on the surface of the driver IC 31, whereby positioning can be performed of the laminated body 104*b* in the Z-axis direction.

8. FIFTH EMBODIMENT

Figure 19:
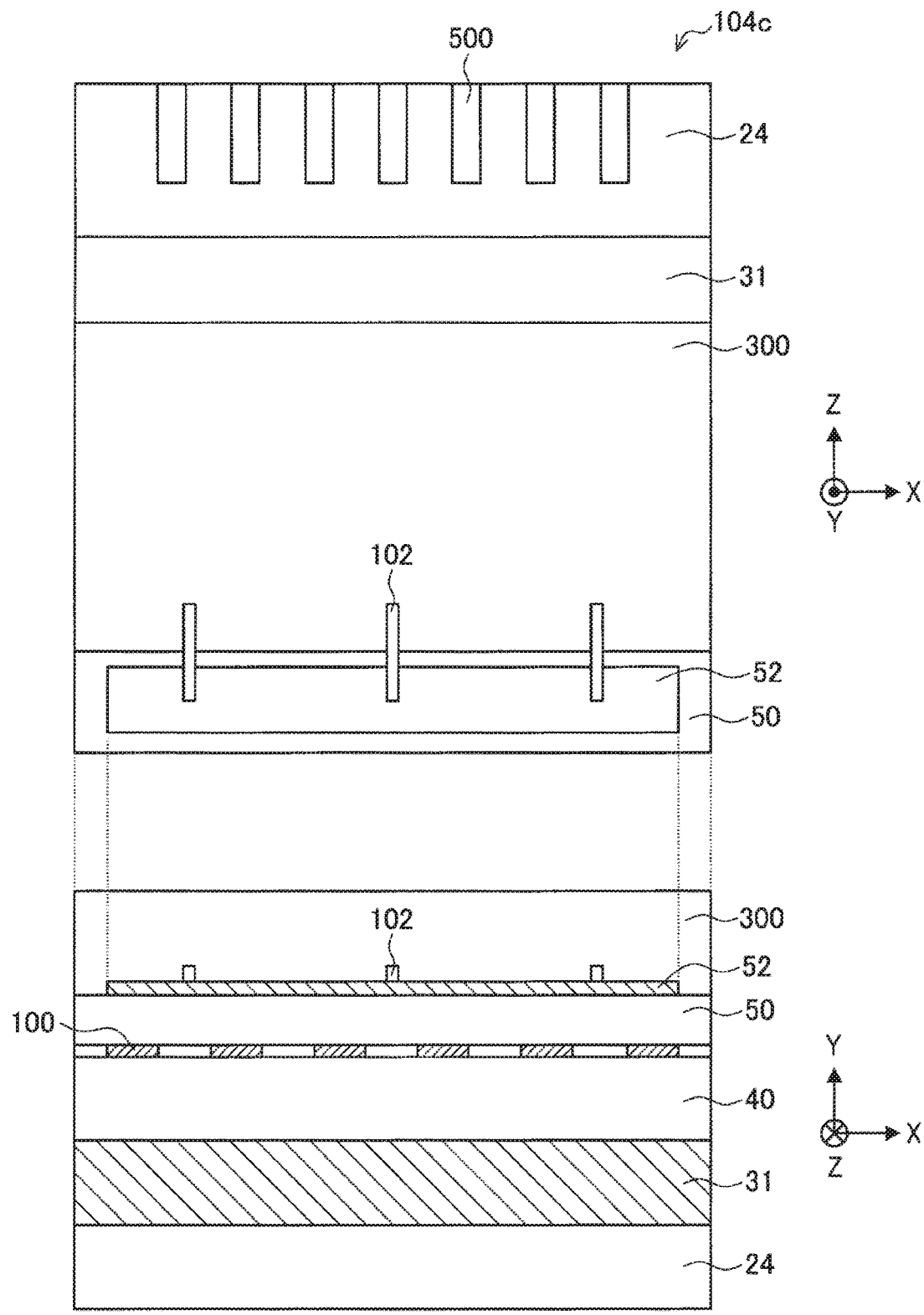
FIG. 19 is an explanatory diagram (part 1) for explaining a manufacturing step of a light-emitting module 30c according to a fifth embodiment of the present disclosure.
Figure 20:
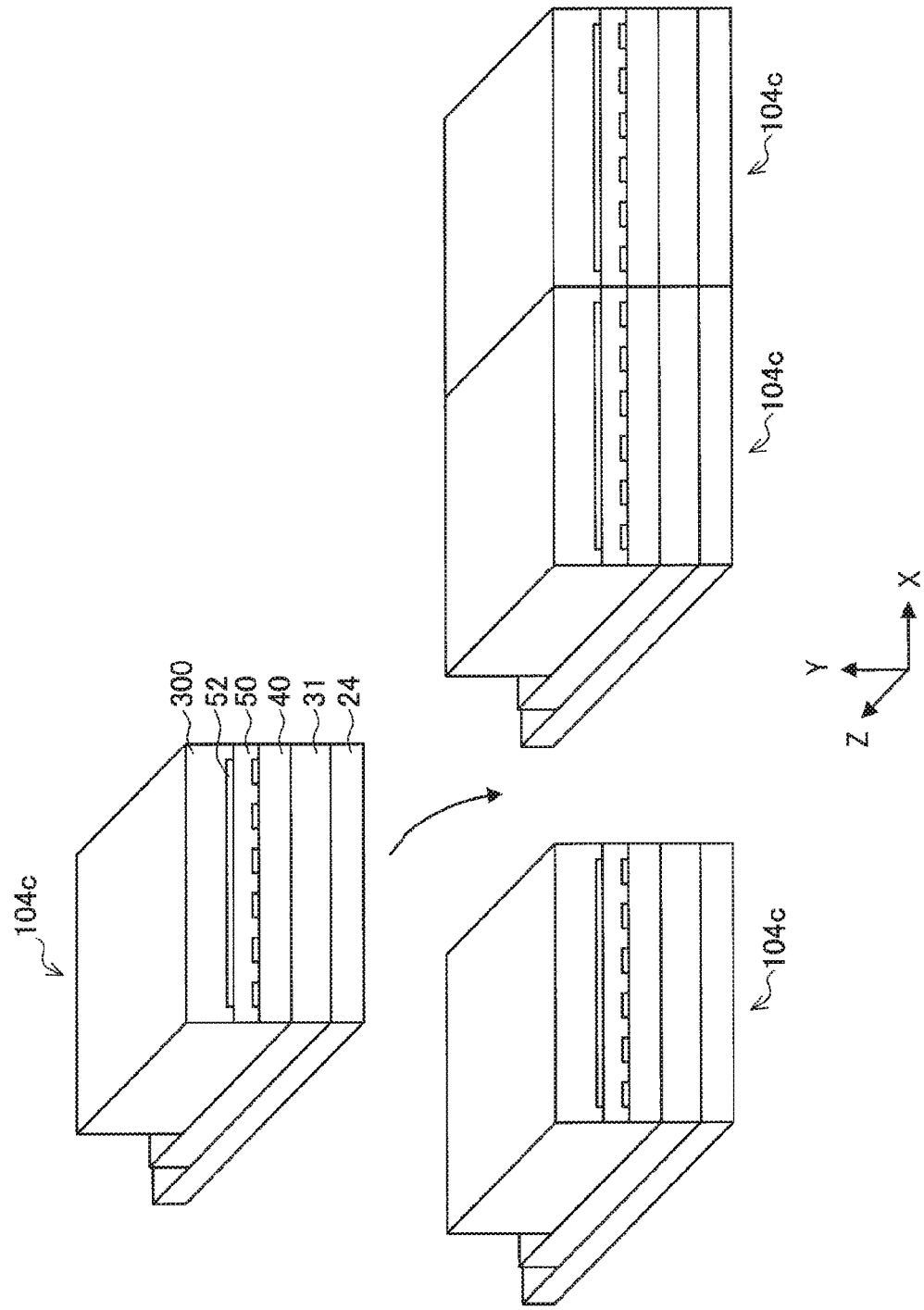
FIG. 20 is an explanatory diagram (part 2) for explaining the manufacturing step of the light-emitting module 30c according to the fifth embodiment of the present disclosure.
Figure 21:
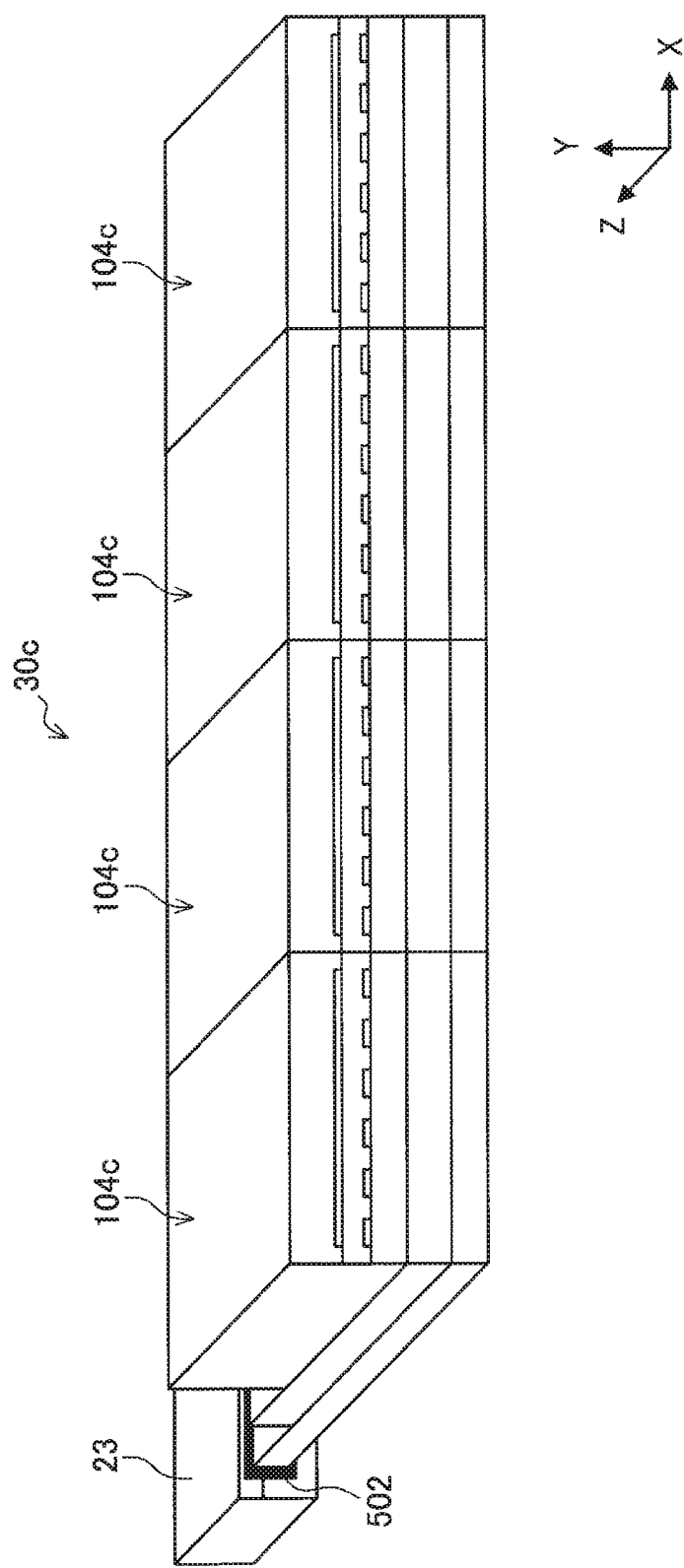
FIG. 21 is an explanatory diagram (part 3) for explaining the manufacturing step of the light-emitting module 30c according to the fifth embodiment of the present disclosure.

By the way, as described in the second embodiment, it is preferable that the light-emitting module 30 has a form in which only a laminated body 104*c* including a defective laser element 51 can be easily replaced. Thus, a fifth embodiment of the present disclosure will be described in which a desired laminated body 104c can be easily replaced, with reference to FIGS. 19 to 21. FIGS. 19 to 21 are explanatory diagrams for explaining a manufacturing step of a light-emitting module 30c according to the present embodiment. In detail, the upper part of FIG. 19 illustrates a top view of the laminated body 104c viewed from above, and the lower part of FIG. 19 illustrates a front view of the laminated body 104c viewed from the front side from which light is emitted. FIG. 20 is a perspective view illustrating a state where a plurality of the laminated bodies 104c is arranged, and FIG. 21 is a perspective view illustrating a state where the plurality of laminated bodies 104c is inserted into the connector 23.

In the present embodiment, unlike the first embodiment, the laminated body 104c described above is not fixed with the paste 106, but can be fixed by being inserted into the connector 23. In other words, in the present embodiment, the desired laminated body 104c can be easily replaced since it is not fixed with the paste 106.

In the present embodiment, similarly to the third embodiment described above, the laminated body 104c includes the multi-laser chip 50 and the sub-mount 40 covered with the resin 300, but is different in that the driver IC 31 and the glass epoxy substrate 24 are further laminated.

In detail, as illustrated in FIG. 19, in the laminated body 104c, the sub-mount 40 and the multi-laser chip 50 are laminated on the driver IC31. Moreover, the driver IC 31 is laminated on the glass epoxy substrate 24. The multi-laser chip 50, the sub-mount 40, the driver IC 31, and the glass epoxy substrate 24 are laminated such that the respective end faces are aligned flush, for the end face side from which light is emitted. Moreover, the surfaces of the multi-laser chip 50 and the sub-mount 40 are covered with the resin 300. Furthermore, the multi-laser chip 50, the sub-mount 40, the driver IC 31, and the glass epoxy substrate 24 are processed by the above-described dicing or polishing, and have the same width (width in the X-axis direction).

Furthermore, the driver IC 31 has a longer depth (length in the Z-axis direction) than that of the sub-mount 40. In addition, the glass epoxy substrate 24 has a longer depth than that of the driver IC 31 (see FIG. 20). Thus, in the driver IC 31 on which the sub-mount 40 is mounted, a part of the surface of the driver IC31 on the connector 23 side is exposed from the sub-mount 40. Moreover, in the glass epoxy substrate 24 on which the driver IC 31 is mounted, a part of the surface of the glass epoxy substrate 24 on the connector 23 side is exposed from the driver IC 31. Then, as illustrated in the upper part of FIG. 19, a connector terminal (circuit) 500 to be connected to the connector 23 is formed on a part of the surface of the glass epoxy substrate 24 exposed from the driver IC 31. Note that, it is assumed that in the laminated body 104c, the multi-laser chip 50, the sub-mount 40, the driver IC 31, and the glass epoxy substrate 24 are fixed to each other with the paste 106.

Then, in the present embodiment, as illustrated in FIG. 20, for the laminated body 104c as described above, similarly to the first embodiment, the plurality of laminated bodies 104c is arranged in a line to cause the side surfaces of the respective laminated bodies 104c to be in contact with each other. Moreover, the connector terminals 500 of the glass epoxy substrates 24 of the plurality of laminated bodies 104c arranged in this way are collectively inserted into an opening 502 of the connector 23, whereby fixing can be made while the state is maintained where the plurality of laminated bodies 104c is arranged. Note that, the opening 502 of the connector 23 has a size corresponding to the thickness and width of the glass epoxy substrates 24, and engages with the connector terminals 500.

In other words, in the present embodiment, the connector 23 can fix the laminated body 104c in a state where it can be inserted and removed. Thus, according to the present embodiment, it is easy to replace the desired laminated body 104c. Note that, since signals can be converted from parallel to serial by an electronic circuit provided in the driver IC 31 and the like, in each of the laminated bodies 104c according to the present embodiment, the number of the connector terminals 500 is less than the number of the laser elements 51 mounted. Thus, even if there is a shift somewhat in the positional relationship between the connector 23 and the connector terminal 500, the use of the light-emitting module 30c is not affected. Note that, in the present embodiment, the inserted laminated body 104c may be fixed to the connector 23 with the paste 106 or the like.

Furthermore, in the present embodiment, to facilitate replacement of the laminated body 104c, a gap having a predetermined size may be provided between the laminated bodies 104c adjacent to each other. In such a case, since alignment in the X-axis direction of the laminated body 104c cannot be performed by causing the side surfaces of the laminated bodies 104c to be in contact with each other, the alignment may be performed, for example, by using the groove 400 as in the fourth embodiment described above.

As described above, according to the present embodiment, the plurality of laser elements 51 can be accurately arranged at narrow intervals, and the desired laminated body 104c can be easily replaced as necessary.

9. SIXTH EMBODIMENT

Figure 22:
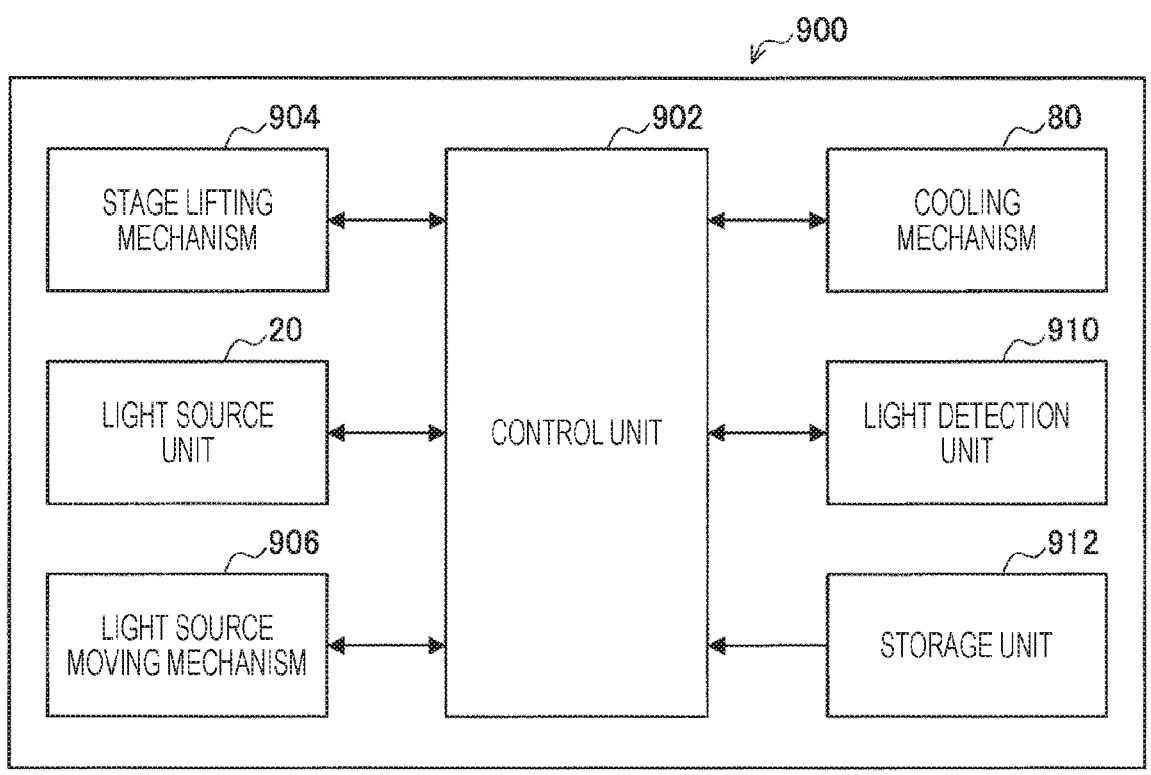
FIG. 22 is a functional block diagram illustrating a stereolithography device 900 according to a sixth embodiment of the present disclosure.

The light source unit 20 including the light-emitting module 30 manufactured by the manufacturing method according to the present embodiment can be mounted on, for example, a stereolithography device (3D printer) 900. With reference to FIG. 22, details will be described of the stereolithography device 900 according to a sixth embodiment of the present disclosure. FIG. 22 is a functional block diagram illustrating the stereolithography device 900 according to the present embodiment.

The stereolithography device 900 is a device capable of forming a three-dimensional formed object by irradiating a photocurable resin with ultraviolet light or the like to cure the resin. As the photocurable resin, for example, an ultraviolet curable resin can be used such as of an epoxy-based or a urethane-based. However, in the present embodiment, the resin is not limited to such an ultraviolet curable resin, and may be a resin cured by light in another wavelength range such as visible light.

As illustrated in FIG. 22, the stereolithography device 900 mainly includes a control unit 902, a stage lifting mechanism 904, the light source unit 20 manufactured according to each of the embodiments described above, a light source moving mechanism 906, the cooling mechanism 80, a light detection unit 910, and a storage unit 912. Hereinafter, details will be described of each functional unit of the stereolithography device 900.

(Control Unit 902)

The control unit 902 includes a central processing unit (CPU) that is an arithmetic processing device, and the like. The control unit 902 can comprehensively control each unit of the stereolithography device 900.

(Stage Lifting Mechanism 904)

The stage lifting mechanism 904 is a mechanism for moving a stage (not illustrated) for instructing a formed object in the vertical direction. For example, the stage lifting mechanism 904 moves the stage described above by a predetermined distance each time a layer including a photocurable resin is formed when the formed object is formed.

(Light Source Unit 20)

The light source unit 20 includes the light-emitting module 30 manufactured by the manufacturing method according to each embodiment of the present disclosure described above. The light source unit 20 exposes (cures) the photocurable resin layer by layer by emitting light to the surface of the photocurable resin while being moved along a scanning direction by the light source moving mechanism 906 described later. The light source unit 20 includes the plurality of laser elements 51, and can expose (cure) the photocurable resin in a dot shape by light beams emitted from the respective laser elements 51.

(Light Source Moving Mechanism 906)

The light source moving mechanism 906 is a mechanism that can move the light source unit 20 in three axis directions of the X-axis, Y-axis, and Z-axis directions. For example, the light source moving mechanism 906 moves the light source unit 20 in the scanning direction when the formed object is formed.

(Cooling Mechanism 80)

The cooling mechanism 80 is attached to the side surface of the light source unit 20 as described above, and cools the light source unit 20 by receiving heat generated by the light source unit 20. The cooling mechanism 80 circulates water inside to cool the light source unit 20.

(Light Detection Unit 910)

The light detection unit 910 includes, for example, a photodiode that can generate an electric signal by receiving light of greater than or equal to a predetermined amount, and detects light emitted from the light source unit 20.

(Storage Unit 912)

The storage unit 912 is implemented by a read only memory (ROM), a random access memory (RAM), a hard disk drive (HDD), and the like, and stores various programs and data necessary for processing by the control unit 902 described above.

The light source unit 20 including the light-emitting module 30 manufactured by the manufacturing method according to the embodiment of the present disclosure described above is mounted on the stereolithography device 900 as described above, and can be used when a three-dimensional formed object is formed.

Note that, the light-emitting module 30 manufactured according to the embodiment of the present disclosure can be mounted not only on the 3D printer as described above, but also on various devices such as a laser printer for printing on paper, a laser display device, a measuring device, and the like.

10. CONCLUSION

As described above, according to the embodiments of the present disclosure, a method of manufacturing the light-emitting module 30 can be provided capable of accurately arranging the plurality of laser elements 51 at narrow intervals.

Note that, again, in the embodiments of the present disclosure, the light-emitting element is not limited to an edge-emitting laser element, and may be an in-plane emitting laser element or an LED element.

11. SUPPLEMENT

In the above, the preferred embodiments of the present disclosure have been described in detail with reference to the accompanying drawings; however, the technical scope of the present disclosure is not limited to such examples. It is obvious that persons having ordinary knowledge in the technical field of the present disclosure can conceive various modification examples or correction examples within the scope of the technical idea described in the claims, and it is understood that the modification examples or correction examples also belong to the technical scope of the present disclosure.

Furthermore, the effects described in the present specification are merely illustrative or exemplary and not restrictive. That is, the technology according to the present disclosure can exhibit other effects obvious to those skilled in the art from the description of the present specification together with the above-described effects or in place of the above-described effects.

Note that, the following configurations also belong to the technical scope of the present disclosure.

(1)

A method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, the method including arranging the plurality of light-emitting elements on the substrate at predetermined intervals along the width direction in the light-emitting module, by causing side surfaces of the respective light-emitting element arrays adjacent to each other along the width direction to be in contact with each other and mounting the respective light-emitting element arrays on the substrate.

(2)

The method of manufacturing a light-emitting module according to (1), in which the respective light-emitting element arrays each include a light-emitting element array chip provided with the plurality of light-emitting elements, and a first circuit board on which an electronic circuit electrically connected to the plurality of light-emitting elements is provided and the light-emitting element array chip is mounted.

(3)

The method of manufacturing a light-emitting module according to (1) or (2), further including forming the light-emitting element arrays each having a predetermined width by dicing.

(4)

The method of manufacturing a light-emitting module according to (1) or (2), further including forming the light-emitting element arrays each having a predetermined width by polishing.

(5)

The method of manufacturing a light-emitting module according to (4), further including forming a stopper layer that determines an end point of the polishing on the light-emitting element arrays.

(6)

The method of manufacturing a light-emitting module according to any one of (1) to (5), further including covering the light-emitting element arrays with resin or glass.

(7)

The method of manufacturing a light-emitting module according to any one of (1) to (6), further including fixing the light-emitting element arrays to the substrate with a thermoplastic paste.

(8)

The method of manufacturing a light-emitting module according to any one of (1) to (6), further including forming an urging member in contact with the light-emitting element arrays on a surface on which the light-emitting element arrays are mounted, of the substrate.

(9)

The method of manufacturing a light-emitting module according to (8), in which the urging member includes heat conductive material.

(10)

The method of manufacturing a light-emitting module according to any one of (1) to (9), in which the predetermined intervals are less than or equal to 50 μm.

(11)

The method of manufacturing a light-emitting module according to any one of (1) to (10), in which the light-emitting elements each are an edge-emitting light-emitting element that emits light from an emission end face of a laminated structure.

(12)

The method of manufacturing a light-emitting module according to any one of (1) to (11), in which the light-emitting elements are laser elements.

(13)

The method of manufacturing a light-emitting module according to any one of (1) to (12), in which the substrate is a second circuit board provided with an electronic circuit.

(14)

The method of manufacturing a light-emitting module according to any one of (1) to (12), in which the substrate is a heat transfer plate.

(15)

A method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, the method including:

forming a first positioning portion on surfaces facing the substrate of the respective light-emitting element arrays;

forming a second positioning portion on a surface facing the plurality of light-emitting element arrays of the substrate; and arranging the plurality of light-emitting elements on the substrate at predetermined intervals along the width direction in the light-emitting module, by causing the first positioning portion and the second positioning portion to engage with each other, and mounting the respective light-emitting element arrays on the substrate.

(16)

The method of manufacturing a light-emitting module according to (15), in which the first positioning portion is formed by forming a groove having a V-shape by wet etching on the surfaces facing the substrate of the respective light-emitting element arrays.

(17)

The method of manufacturing a light-emitting module according to (16), in which the surfaces facing the substrate of the respective light-emitting element arrays include the 001 plane of a silicon substrate.

(18)

A method of manufacturing a light-emitting module including: a plurality of light-emitting element arrays each including, in a plane parallel to resonator length of a light-emitting element, a plurality of the light-emitting elements arranged along a width direction perpendicular to a direction of the resonator length; and a connector electrically connected to the plurality of light-emitting element arrays, the respective light-emitting element arrays each including a light-emitting element array chip provided with the plurality of light-emitting elements, and a circuit board on which a connector terminal electrically connected to the connector is provided and the light-emitting element array chip is mounted, the method including arranging the plurality of light-emitting elements at predetermined intervals along the width direction in the light-emitting module, by inserting the connector terminals of the respective light-emitting element arrays into an opening of the connector.

(19)

A light-emitting module including:

a plurality of light-emitting element arrays each including, in a plane parallel to resonator length of a light-emitting element, a plurality of the light-emitting elements arranged along a width direction perpendicular to a direction of the resonator length; and a substrate on which the plurality of light-emitting element arrays is mounted, in which side surfaces of the respective light-emitting element arrays adjacent to each other along the width direction are in contact with each other, and the plurality of light-emitting elements is arranged on the substrate at predetermined intervals along the width direction.

(20)

A device on which the light-emitting module according to (19) is mounted.

REFERENCE SIGNS LIST

20 Light source unit
21 Housing
22 Convergent rod lens
22a Rod lens
23 Connector
24 Glass epoxy substrate
25 Heat transfer plate
26, 27 Base
26a, 27a Groove portion
30, 30a, 30b, 30c Light-emitting module
31 Driver IC
31a Recessed portion
31b Protruding portion
32, 33, 42, 43 Electrode pad
40, 40a Sub-mount
44, 53 Alignment mark
50 Multi-laser chip
51 Laser element
52 Common electrode
54 Individual electrode 80 Cooling mechanism
83 O-ring
100 Bump
102 Wire
104, 104a, 104b, 104c Laminated body
106 Paste
200 Urging member
300 Resin
400, 400a, 400b, 400c groove
500 Connector terminal
502 Opening
900 Stereolithography device
902 Control unit
904 Stage lifting mechanism
906 Light source moving mechanism
910 Light detection unit
912 Storage unit
A, B, C, D Arrow

The invention claimed is:

1. A method of manufacturing a light-emitting module, the method comprising:
in the light-emitting module that includes: a plurality of light-emitting element arrays, wherein each light-emitting element array of the plurality of light-emitting element arrays includes, in a plane parallel to a resonator length of a light-emitting element, a plurality of light-emitting elements arranged along a width direction perpendicular to a direction of the resonator length; and a substrate on which the plurality of light-emitting element arrays is mounted:
arranging the plurality of light-emitting elements on the substrate at determined intervals along the width direction in the light-emitting module, wherein
the arrangement causes a side surface of a first light-emitting element array of the plurality of light-emitting element arrays to be in contact with to a side surface of a second light-emitting element array of the plurality of light-emitting element arrays, and
the first light-emitting element array is adjacent to the second light-emitting element array along the width direction;
mounting each light-emitting element array of the plurality of light-emitting element arrays on a mounting surface of the substrate; and
forming an urging member on a side surface of a protruding portion of the substrate, wherein
the protruding portion protrudes upward from the mounting surface of the substrate, and
the urging member is formed to be in contact with a side surface of each light-emitting element array of the plurality of light-emitting element arrays.

2. The method according to claim 1, wherein each light-emitting element array of the plurality of light-emitting element arrays includes:
a light-emitting element array chip that includes the plurality of light-emitting elements; and
a first circuit board configured to mount an electronic circuit electrically connected to the plurality of light-emitting elements and the light-emitting element array chip.

3. The method according to claim 1, further comprising forming the plurality of light-emitting element arrays each having a determined width by dicing.

4. The method according to claim 1, further comprising forming the plurality of light-emitting element arrays each having a determined width by polishing.

5. The method according to claim 4, further comprising forming a stopper layer that determines an end point of the polishing on the plurality of light-emitting element arrays.

6. The method according to claim 1, further comprising covering the plurality of light-emitting element arrays with one of resin or glass.

7. The method according to claim 1, further comprising fixing the plurality of light-emitting element arrays to the substrate with a thermoplastic paste.

8. The method according to claim 1, further comprising forming the urging member in contact with the plurality of light-emitting element arrays on the mounting surface of the substrate.

9. The method according to claim 8, wherein the urging member includes heat conductive material.

10. The method according to claim 1, wherein the determined intervals are less than or equal to 50 μm.

11. The method according to claim 1, wherein each light-emitting element of the plurality of light-emitting elements is an edge-emitting light-emitting element configured to emit light from an emission end face of a laminated structure.

12. The method according to claim 1, wherein the plurality of light-emitting elements includes laser elements.

13. The method according to claim 1, wherein the substrate includes a circuit board with an electronic circuit.

14. The method according to claim 1, wherein the substrate includes a heat transfer plate.

* * * * *